(12) United States Patent
Chen et al.

(10) Patent No.: US 11,990,413 B2
(45) Date of Patent: May 21, 2024

(54) THREE-DIMENSIONAL MEMORY DEVICE INCLUDING ALUMINUM ALLOY WORD LINES AND METHOD OF MAKING THE SAME

(71) Applicant: SANDISK TECHNOLOGIES LLC, Addison, TX (US)

(72) Inventors: Linghan Chen, Nagoya (JP); Raghuveer S. Makala, Campbell, CA (US); Fumitaka Amano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 309 days.

(21) Appl. No.: 17/399,710

(22) Filed: Aug. 11, 2021

(65) Prior Publication Data

US 2023/0051815 A1    Feb. 16, 2023

(51) Int. Cl.
*H01L 23/532*      (2006.01)
*H01L 21/768*      (2006.01)
(Continued)

(52) U.S. Cl.
CPC .. *H01L 23/53219* (2013.01); *H01L 21/76802* (2013.01); *H01L 21/76877* (2013.01); *H01L 21/76888* (2013.01); *H01L 23/5226* (2013.01); *H01L 23/53223* (2013.01); *H10B 41/27* (2023.02); *H10B 43/27* (2023.02)

(58) Field of Classification Search
CPC .............. H10B 69/00; H10B 41/00–70; H10B 43/00–50; H01L 2924/1451; H01L 21/0223–02244; H01L 21/02249; H01L 21/02323–02326; H01L 21/02614; H01L 21/164; H01L 21/3165–31687; H01L 21/32105; H01L 21/76855; H01L 21/76888; H01L 21/24–248; H01L 21/40; G11C 16/02; G11C 16/0408–0458; G11C 16/0483; G11C 11/5621–5642;
(Continued)

(56) References Cited

U.S. PATENT DOCUMENTS 8,349,681 B2    1/2013   Alsmeier et al.
8,658,499 B2    2/2014   Makala et al.
(Continued)

OTHER PUBLICATIONS

International Search Report and Written Opinion of the International Searching Authority for International Patent Application No. PCT/US2022/027545, dated Aug. 23, 2022, 10 pages.
(Continued)

*Primary Examiner* — Eric A. Ward
*Assistant Examiner* — Nora Taylor Nix
(74) *Attorney, Agent, or Firm* — THE MARBURY LAW GROUP PLLC

(57) ABSTRACT

A three-dimensional memory device includes an alternating stack of insulating layers and electrically conductive layers. The electrically conductive layers include an intermetallic alloy of aluminum and at least one metal other than aluminum. Memory openings vertically extend through the alternating stack. Memory opening fill structures are located in a respective one of the memory openings and include a respective vertical semiconductor channel and a respective vertical stack of memory elements.

10 Claims, 35 Drawing Sheets

(51) Int. Cl.
*H01L 23/522* (2006.01)
*H10B 41/27* (2023.01)
*H10B 43/27* (2023.01)

(58) Field of Classification Search
CPC ....... G11C 2216/06–10; G11C 16/0466–0475; G11C 27/005; G11C 11/5671
See application file for complete search history.

(56) References Cited

U.S. PATENT DOCUMENTS

| | | | |
|---|---|---|---|
| 9,252,151 | B2 | 2/2016 | Chien et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,576,975 | B2 | 2/2017 | Zhang et al. |
| 9,875,929 | B1 | 1/2018 | Shukla et al. |
| 10,290,652 | B1 | 5/2019 | Sharangpni et al. |
| 11,049,807 | B2 | 6/2021 | Li et al. |
| 2007/0164323 | A1 | 7/2007 | Forbes et al. |
| 2009/0230459 | A1* | 9/2009 | Kito ............. H01L 29/7881 438/257 |
| 2016/0111434 | A1 | 4/2016 | Pachamuthu et al. |
| 2020/0328284 | A1* | 10/2020 | Greenlee ............ H10B 41/27 |
| 2022/0085055 | A1* | 3/2022 | Geng ............ H01L 29/40117 |
| 2022/0238548 | A1* | 7/2022 | Liu ............ H10B 43/10 |
| 2022/0406809 | A1* | 12/2022 | Takashima ........... H10B 41/20 |

OTHER PUBLICATIONS

Endoh et al., "Novel Ultra High Density Memory with a Stacked-Surrounding Gate Transistor (S-SGT) Structured Cell," IEDM Proc. (2001) 33-36.
Yamaguchi et al., "Electrical Resistivity of NiAl, CoAl, NiGa, and CoGa," Journal of Applied Physics 39, 231 (1968) 3pgs.
Choi et al., "On the Potential of Tungsten as Next-Generation Semiconductor Interconnects," Electronic Materials Letters, 13, 449-459 (2017).
Chen et al., "Interdiffusion Reliability and Resistivity Scaling of Intermetallic Compounds as Advanced Interconnect Materials," J. Appl. Phys. 129, 035301 (2021) 10pgs.
Mehrer "Diffusion in Intermetalics," Materials Transactions, *JIM*, vol. 37, No. 6 (1996), pp. 1259-1280.
Chen et al., "Liner-and Barrier-free NiAl Metallization: A Perspective from TDDB Reliability and Interface Status," Applied Surface Science, 497 (2019) 143810, 5pgs.
Perng et al., "Self-forming $AlO_x$ Layer as Cu Diffusion Barrier on Porous Low-k Film," Thin Solid Films 518 (2010) 1648-1652.
Nakatani, "Ultramicro Fabrications on Fe-Ni Alloys Using Electron-Beam Writing and Reactive-Ion Etching," IEEE Transactions on Magnetics, vol. 32, No. 5, Sep. 1996.
Li et al., "Growth of Atomically Smooth Epitaxial Nickel Ferrite Films by Direct Liquid Injection CVD" Chem. Vap. Deposition 2011, 17, 261-269.
U.S. Appl. No. 16/801,456, filed Feb. 26, 2020, Sandisk Technologies LLC.
U.S. Appl. No. 17/001,003, filed Aug. 24, 2020, Sandisk Technologies LLC.
U.S. Appl. No. 17/378,196, filed Jul. 16, 2021, Sandisk Technologies LLC.

\* cited by examiner

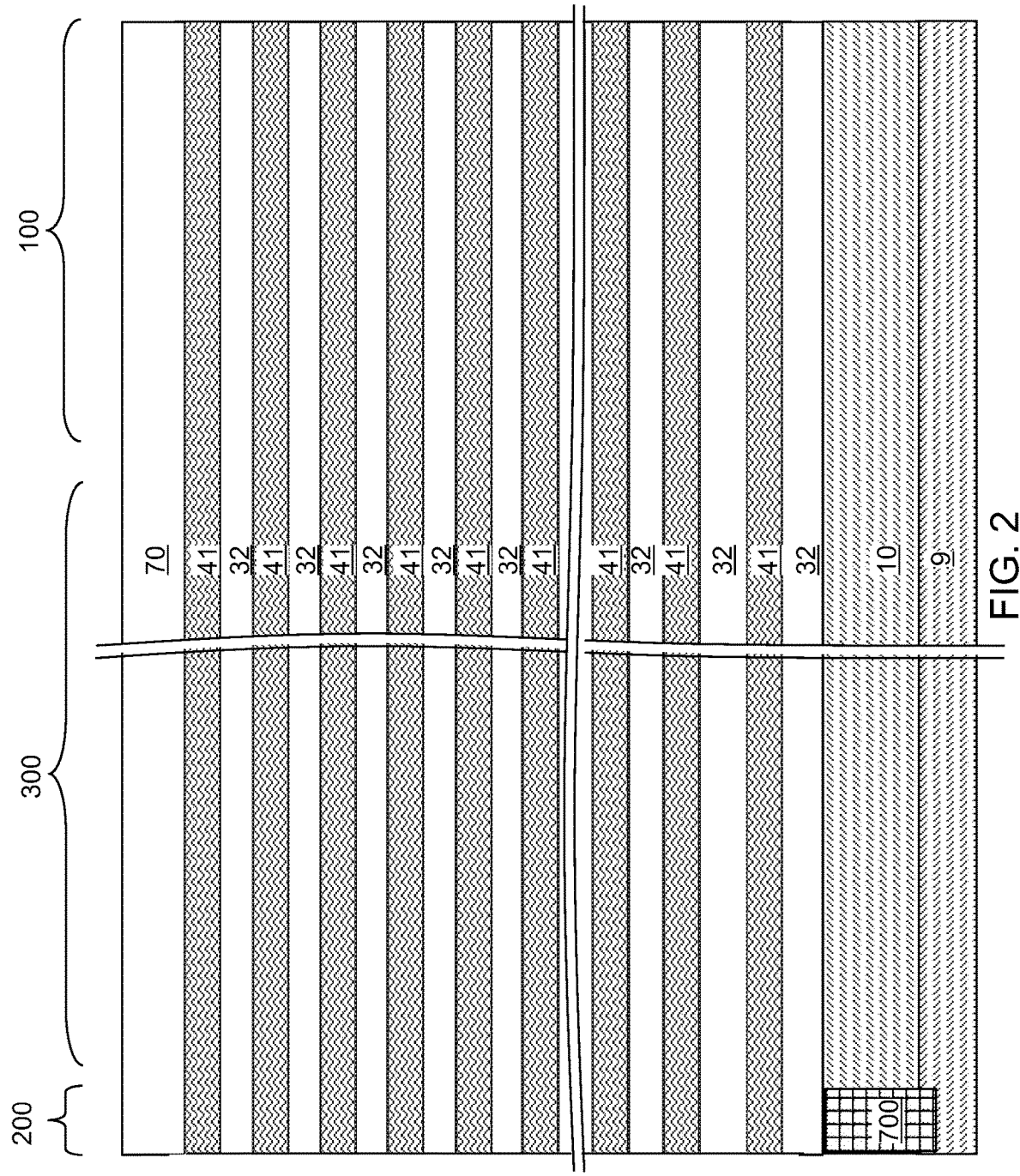

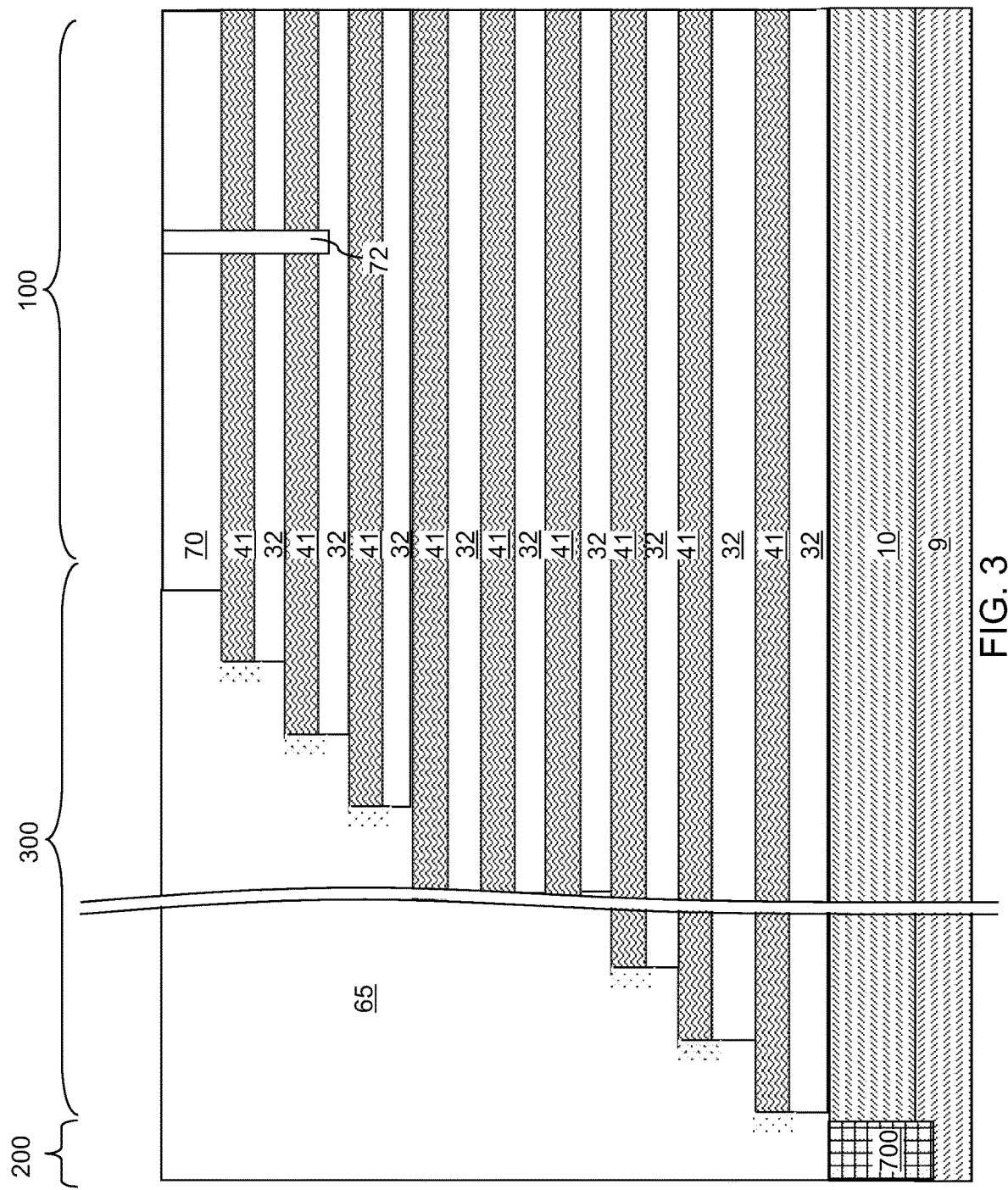

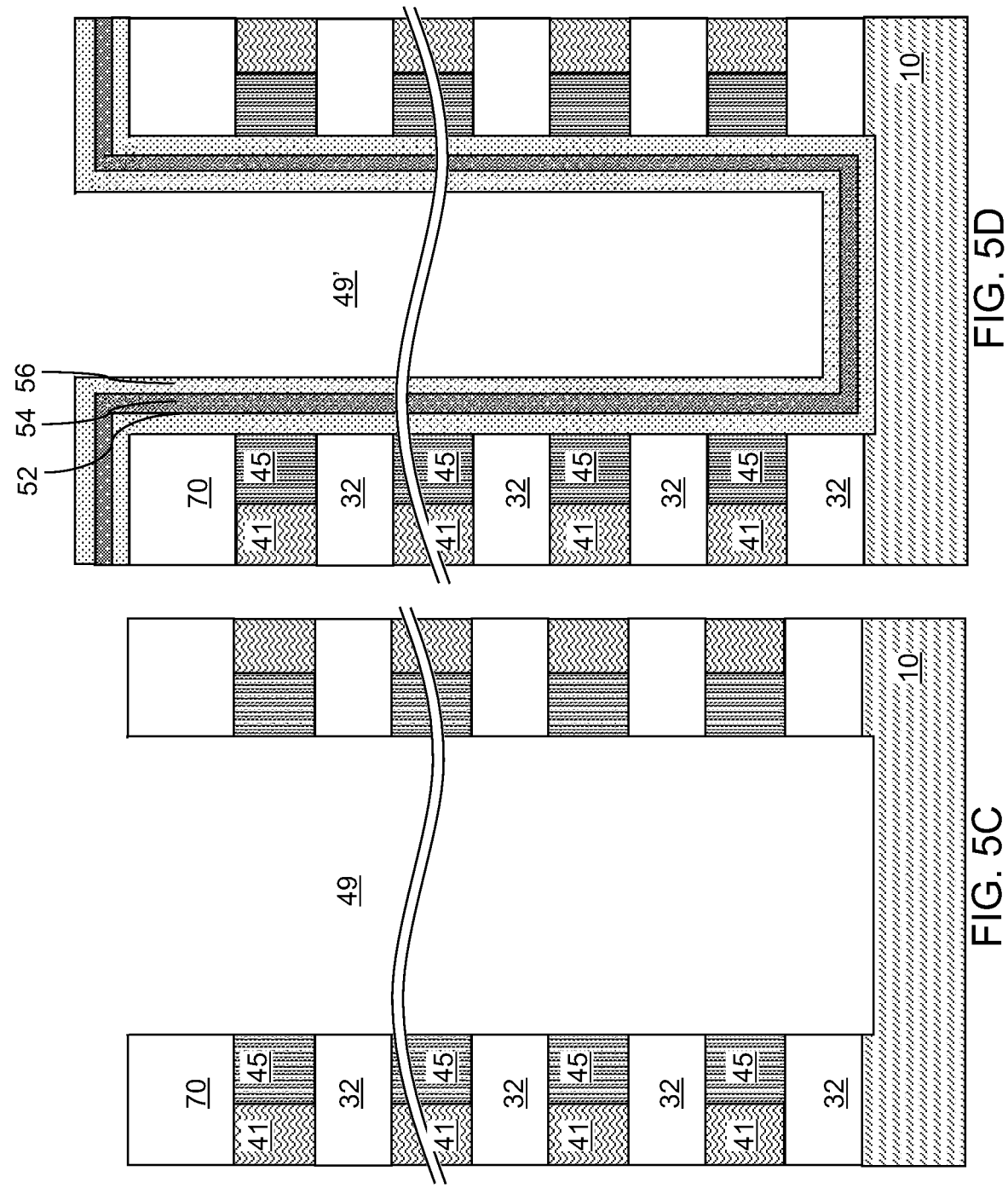

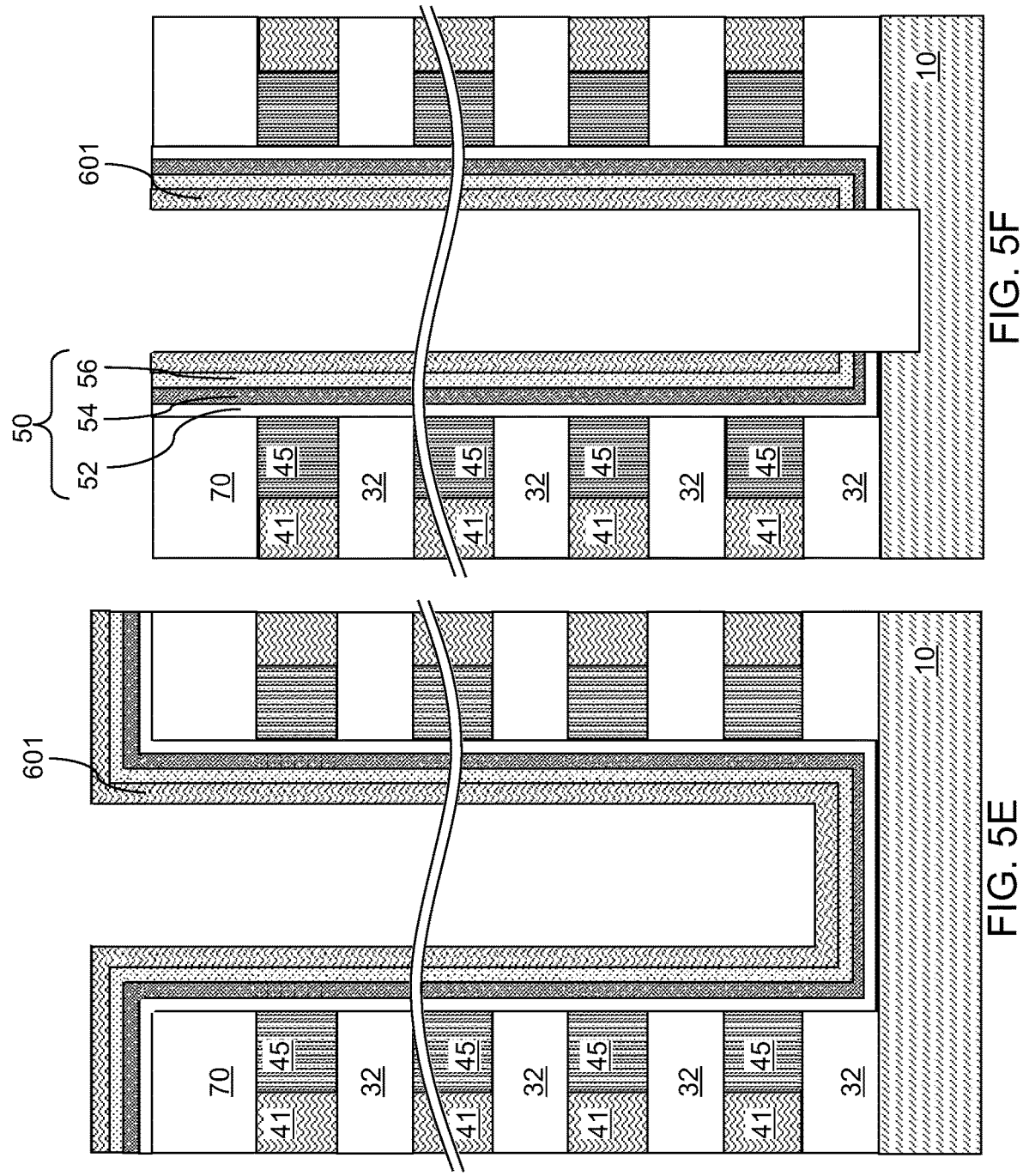

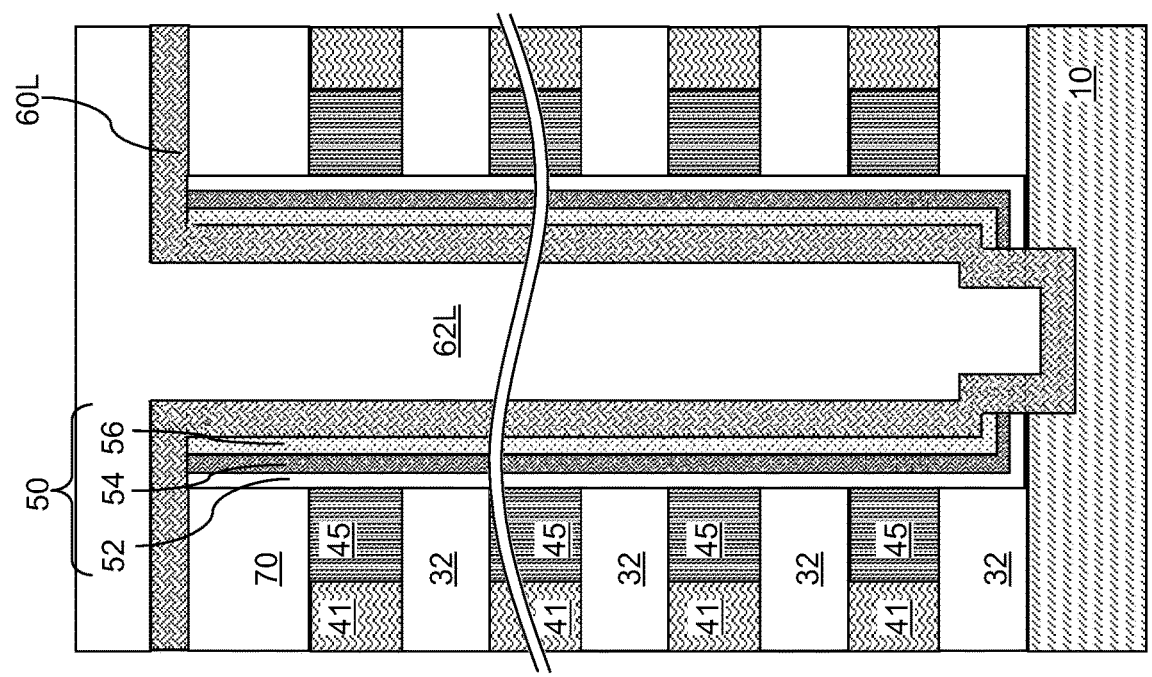
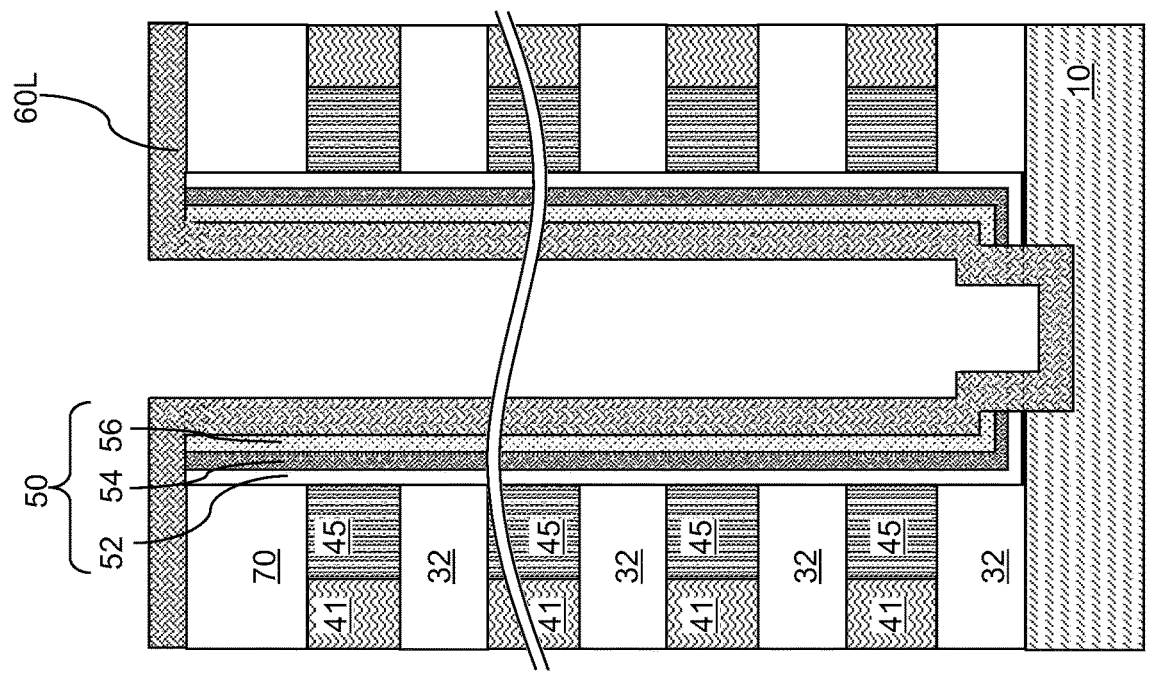

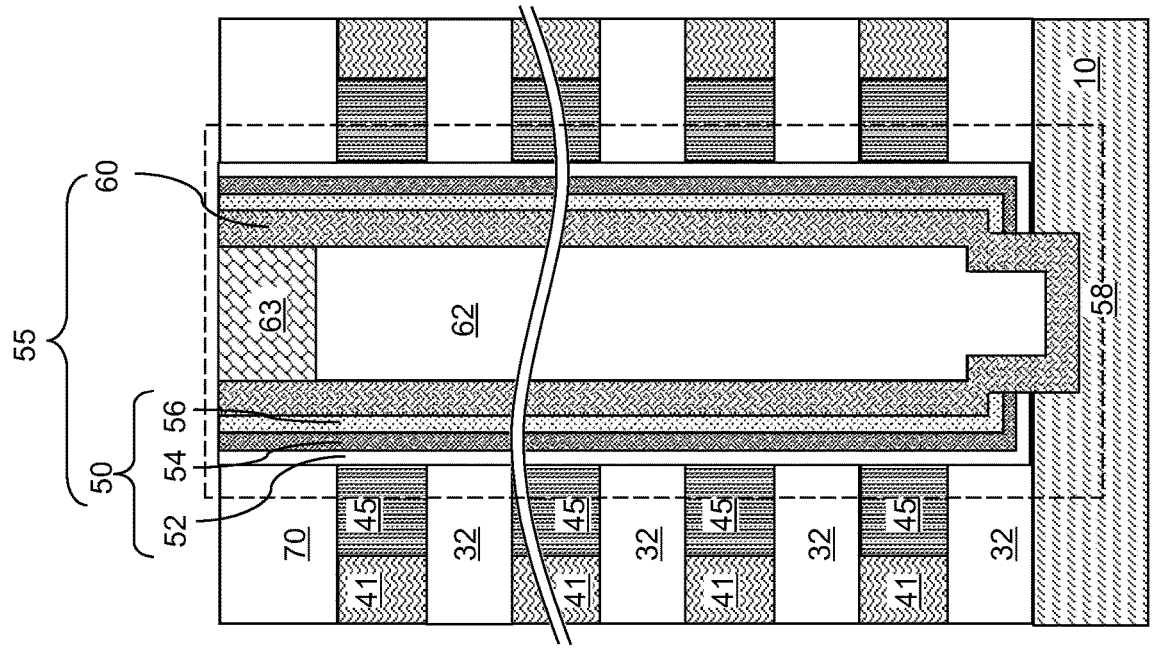
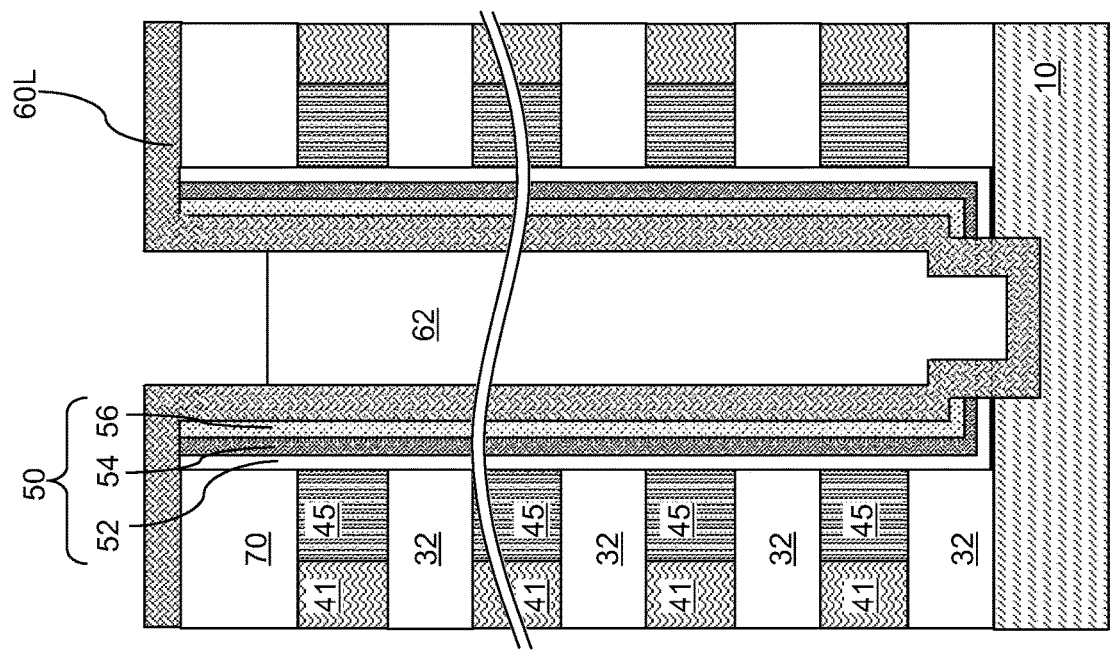
FIG. 5J
FIG. 5I

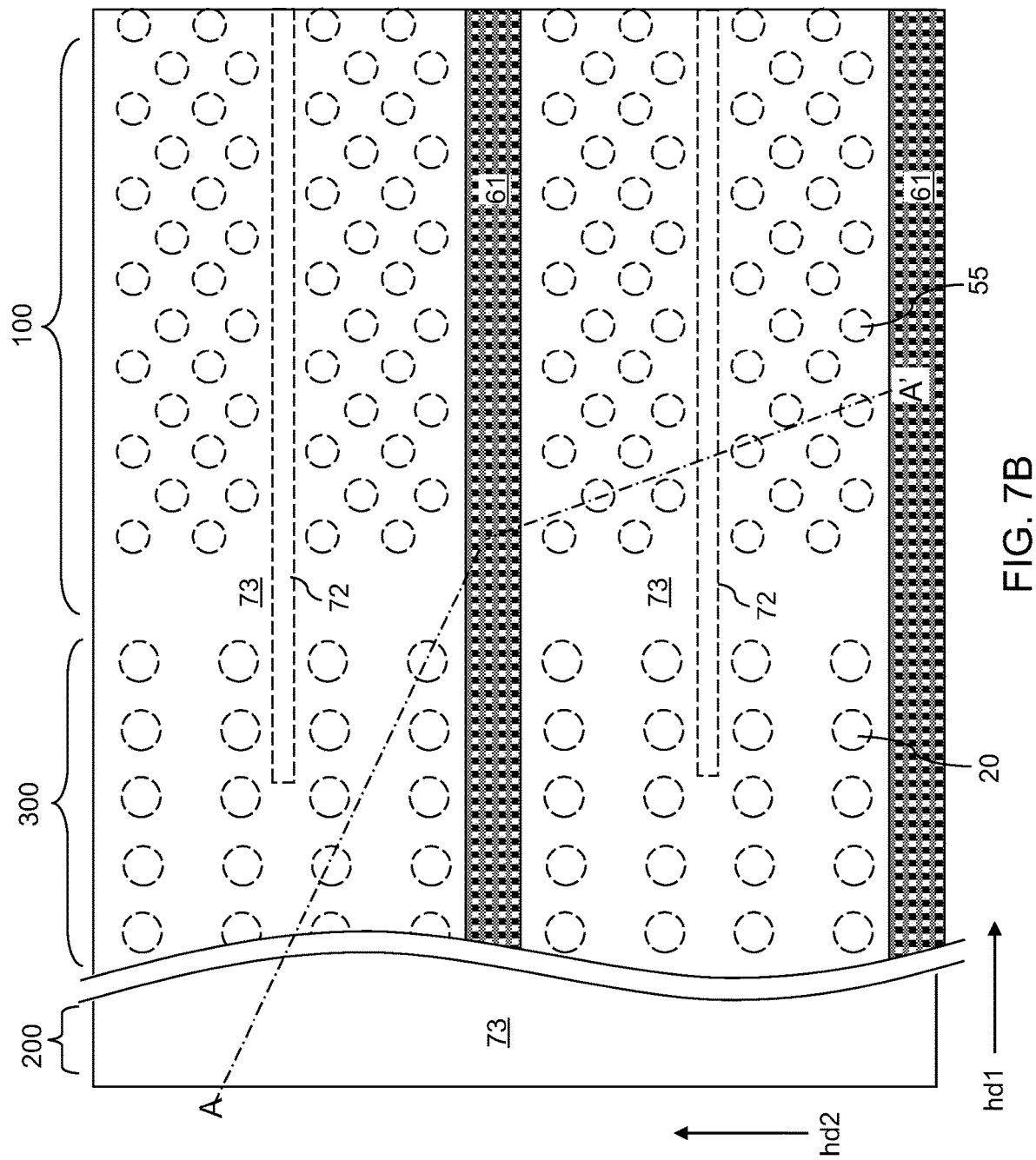

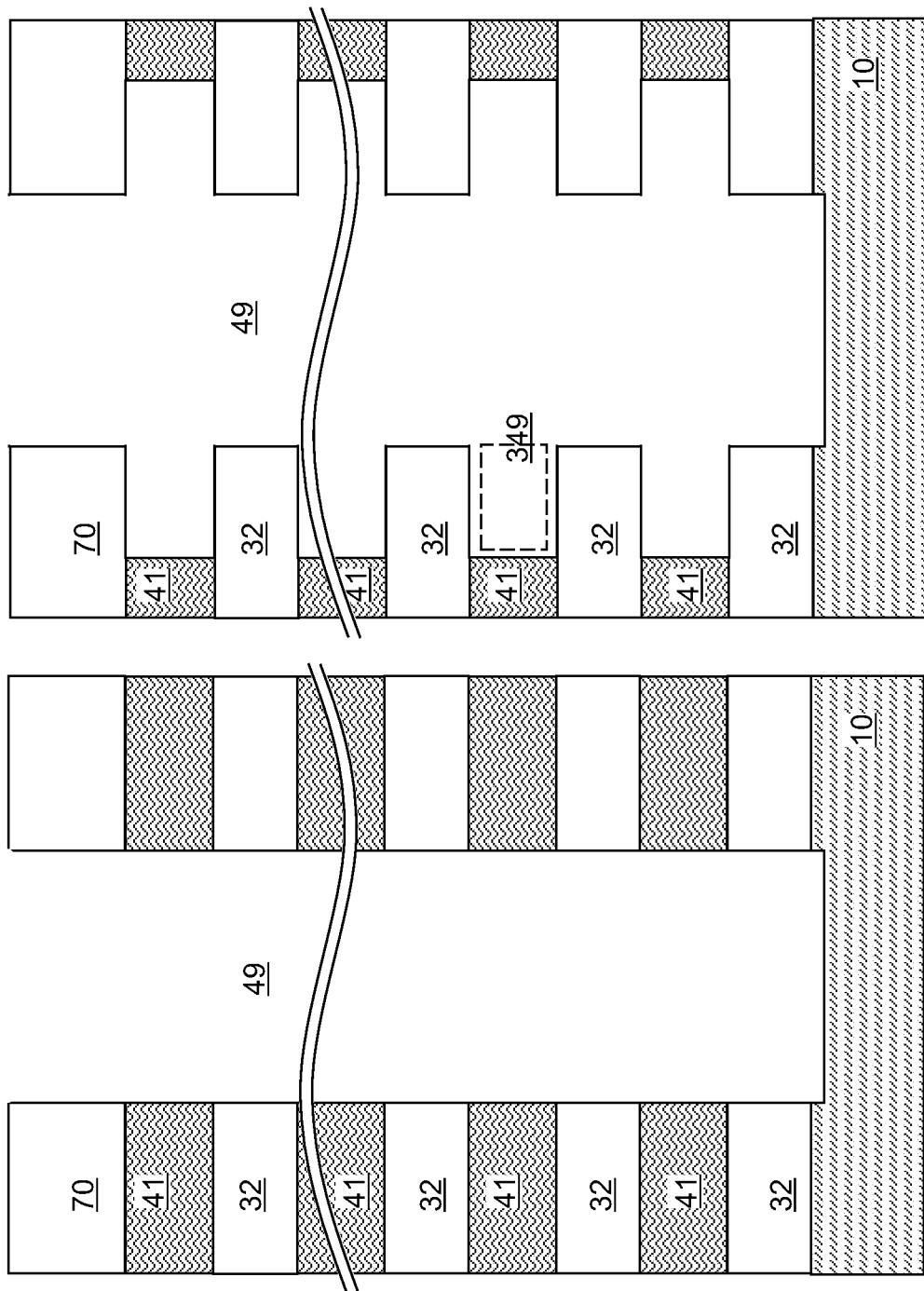

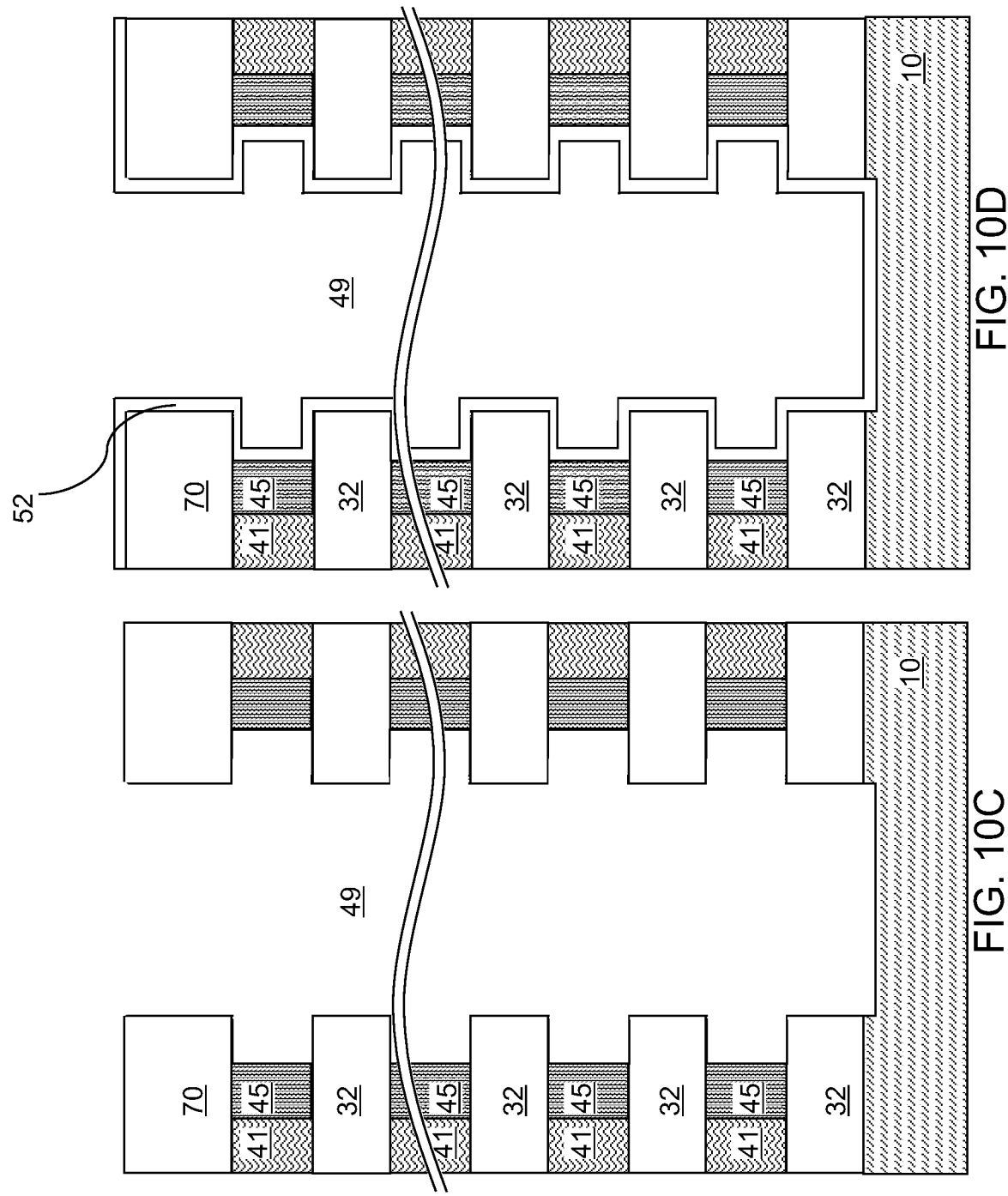

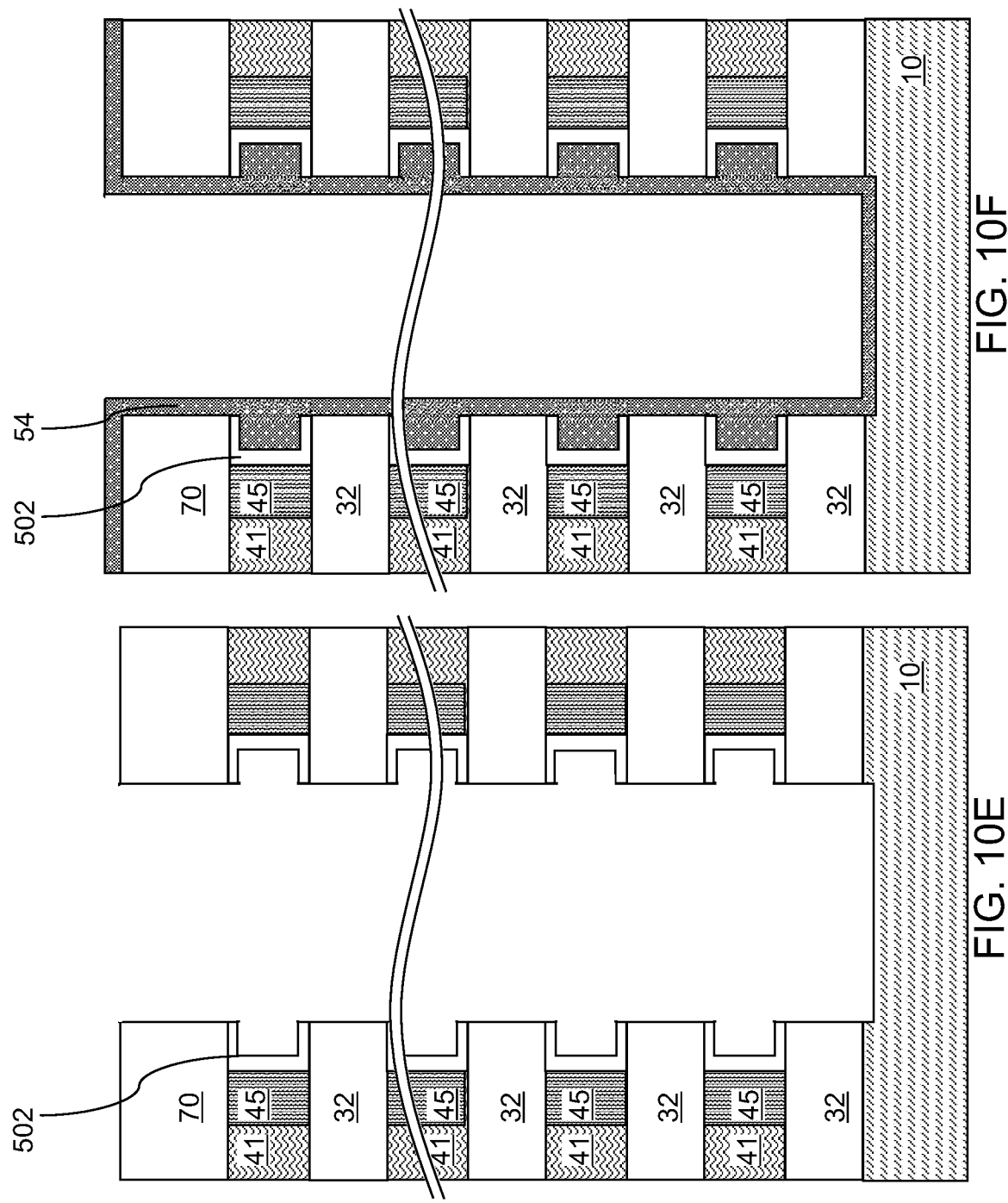

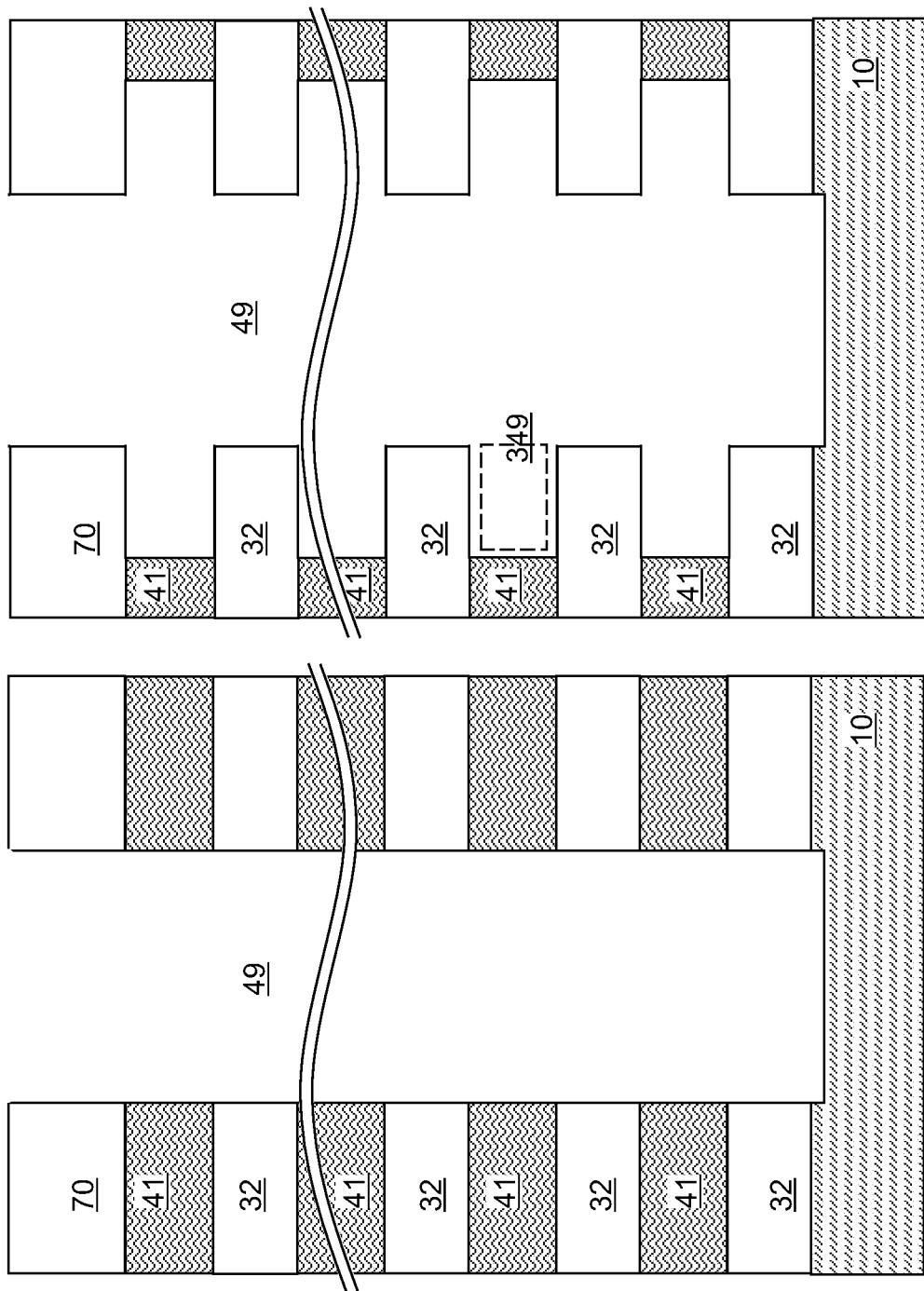

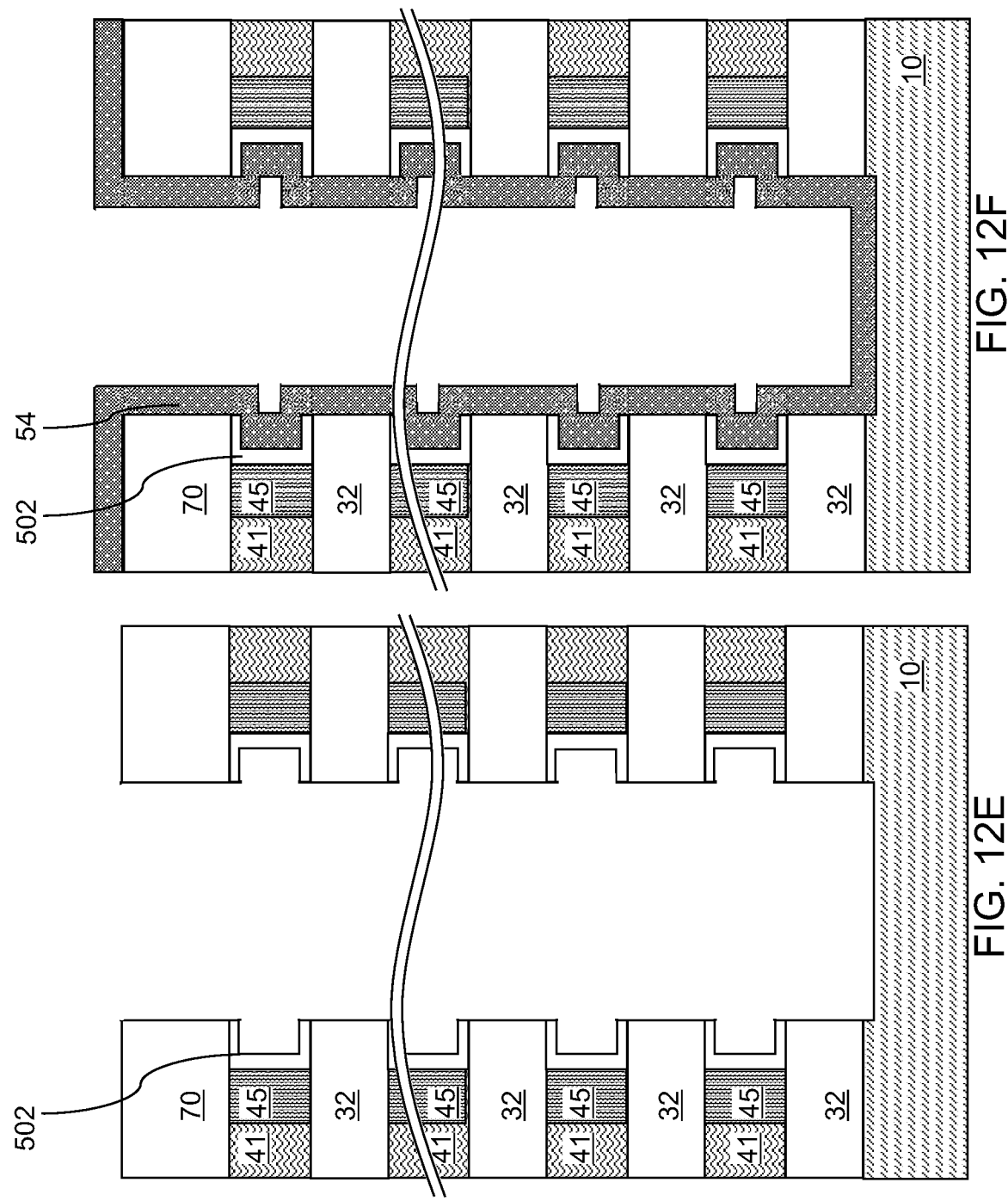

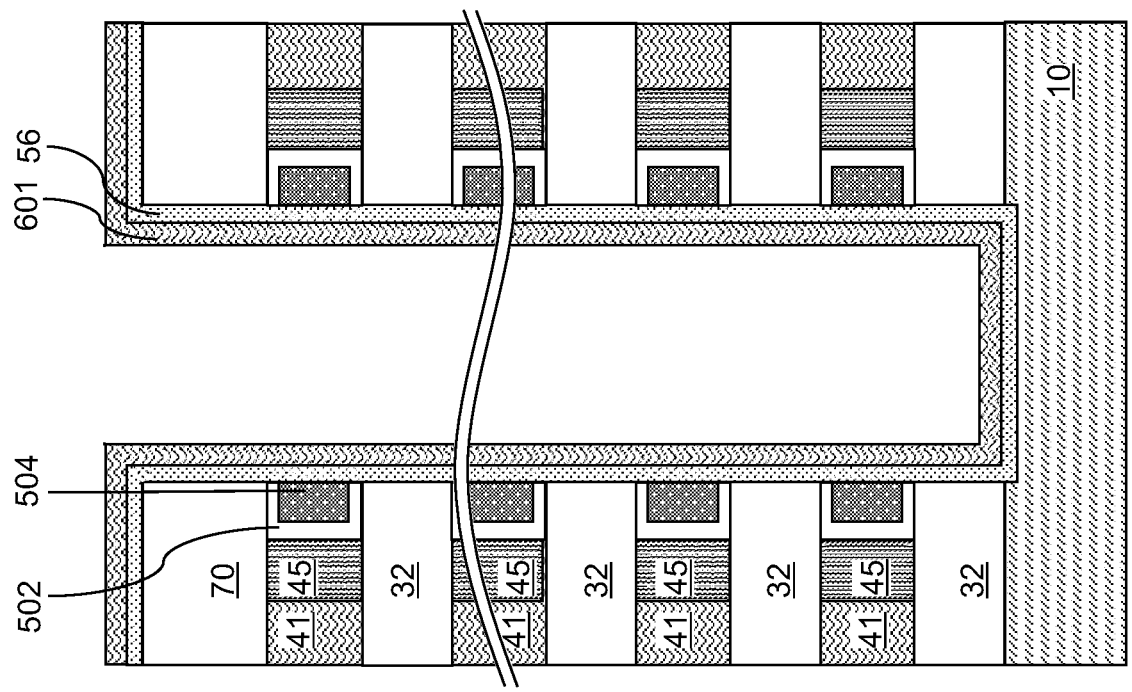
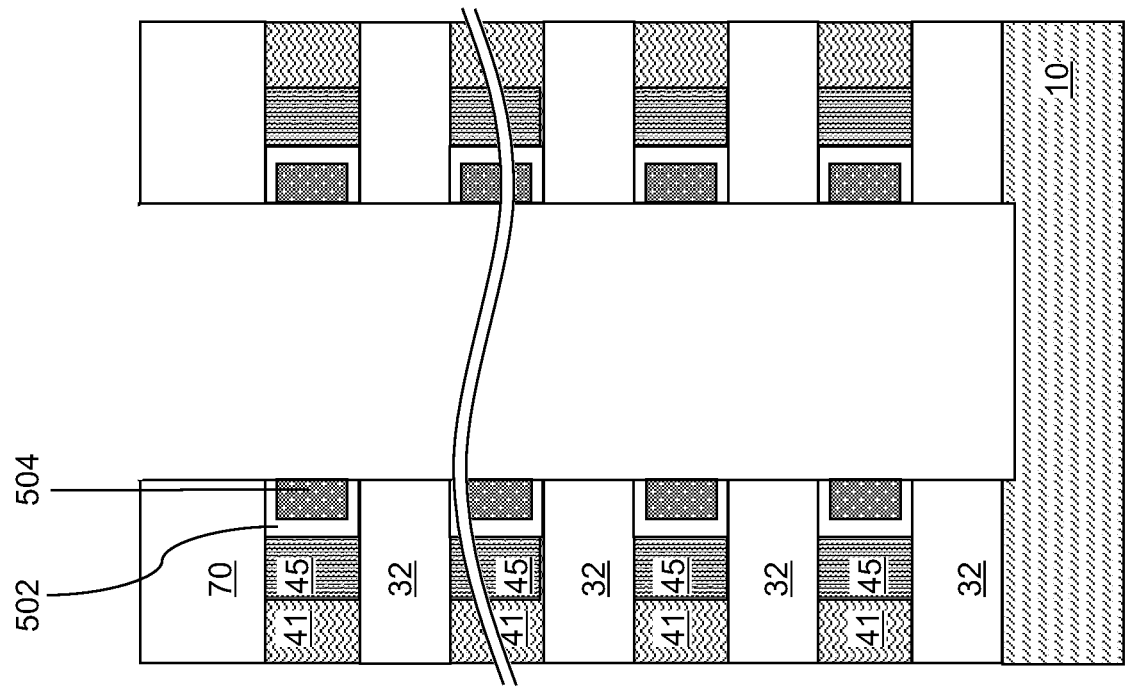

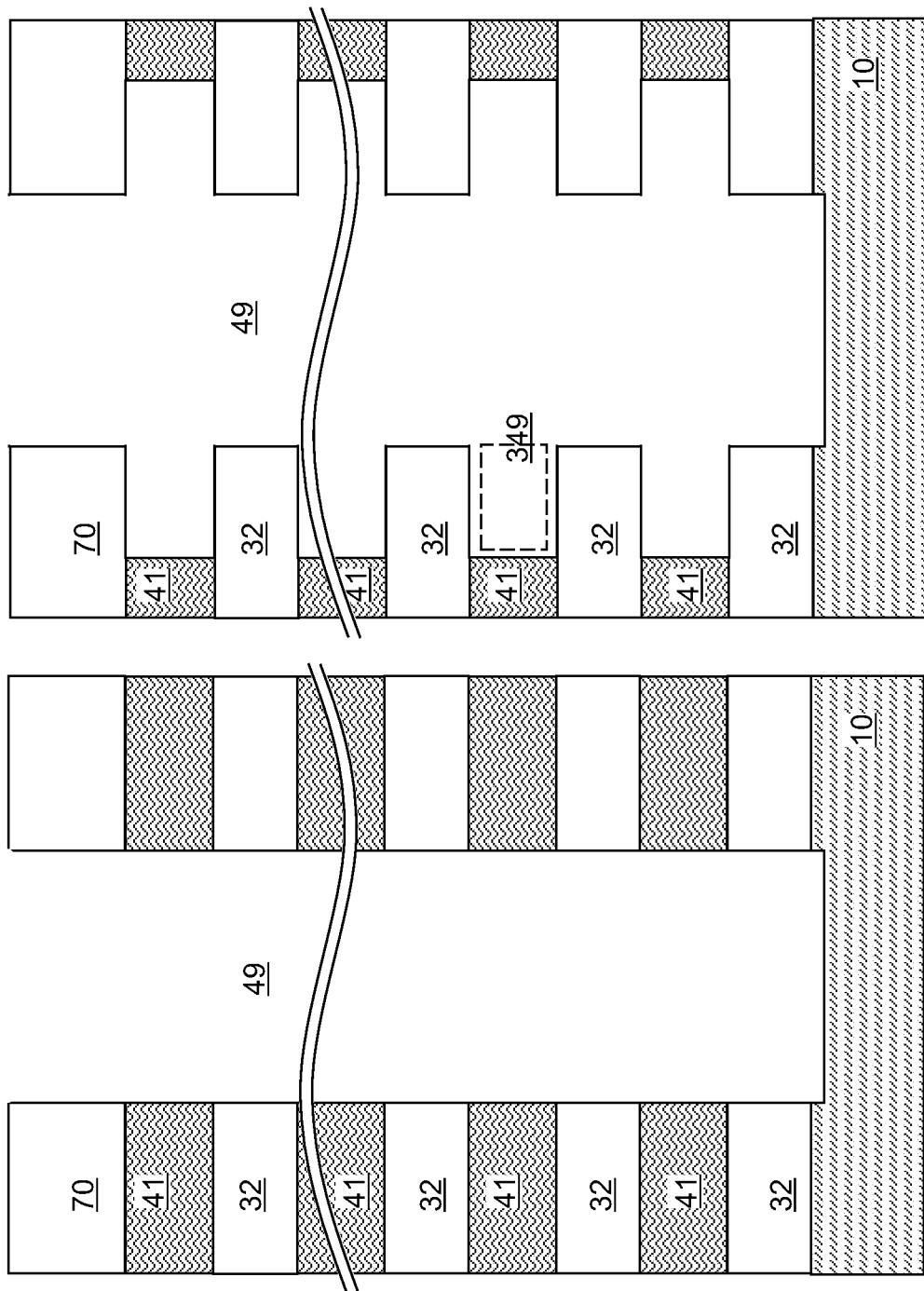

THREE-DIMENSIONAL MEMORY DEVICE INCLUDING ALUMINUM ALLOY WORD LINES AND METHOD OF MAKING THE SAME

FIELD

The present disclosure relates generally to the field of semiconductor devices, and particularly to a three-dimensional memory device including aluminum alloy word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the electrically conductive layers comprise an intermetallic alloy of aluminum and at least one metal other than aluminum; memory openings vertically extending through the alternating stack; and memory opening fill structures located in a respective one of the memory openings and comprising a respective vertical semiconductor channel and a respective vertical stack of memory elements.

According to another aspect of the present disclosure, a method of forming a three-dimensional memory device, comprising: forming an alternating stack of aluminum layers and insulating layers over a substrate; forming a memory opening through the alternating stack; forming lateral recesses around the memory opening by laterally recessing the aluminum layers selective to the insulating layers around the memory opening; forming annular metal portions in the lateral recesses by depositing at least one metal other than aluminum in the lateral recesses; forming a memory opening fill structure on sidewalls of the annular metal portions and in the memory opening, wherein the memory opening fill structure comprises a vertical stack of memory elements and a vertical semiconductor channel; and forming electrically conductive layers comprising an intermetallic alloy of aluminum and the at least one metal other than aluminum by inducing interdiffusion between aluminum in the aluminum layers and the at least one metal in the annular metal portions.

BRIEF DESCRIPTION OF THE DRAWINGS

FIG. 2 is a schematic vertical cross-sectional view of the first exemplary structure after formation of an alternating stack of insulating layers and aluminum layers according to an embodiment of the present disclosure.

FIG. 3 is a schematic vertical cross-sectional view of the first exemplary structure after formation of stepped terraces, a retro-stepped dielectric material portion, and drain-select-level isolation structures according to an embodiment of the present disclosure.

FIGS. 5A-5J are sequential schematic vertical cross-sectional views of a memory opening within the first exemplary structure during formation of a memory stack structure, an optional dielectric core, and a drain region therein according to an embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 10A-10H are sequential schematic vertical cross-sectional views of a memory opening within a second exemplary structure during formation of a memory stack structure, an optional dielectric core, and a drain region therein according to an embodiment of the present disclosure.

FIGS. 12A-12I are sequential schematic vertical cross-sectional views of a memory opening within a third exemplary structure during formation of a memory stack structure, an optional dielectric core, and a drain region therein according to an embodiment of the present disclosure.

FIGS. 14A-14I are sequential schematic vertical cross-sectional views of a memory opening within a fourth exemplary structure during formation of a memory stack structure, an optional dielectric core, and a drain region therein according to an embodiment of the present disclosure.

DETAILED DESCRIPTION

Figure 1:
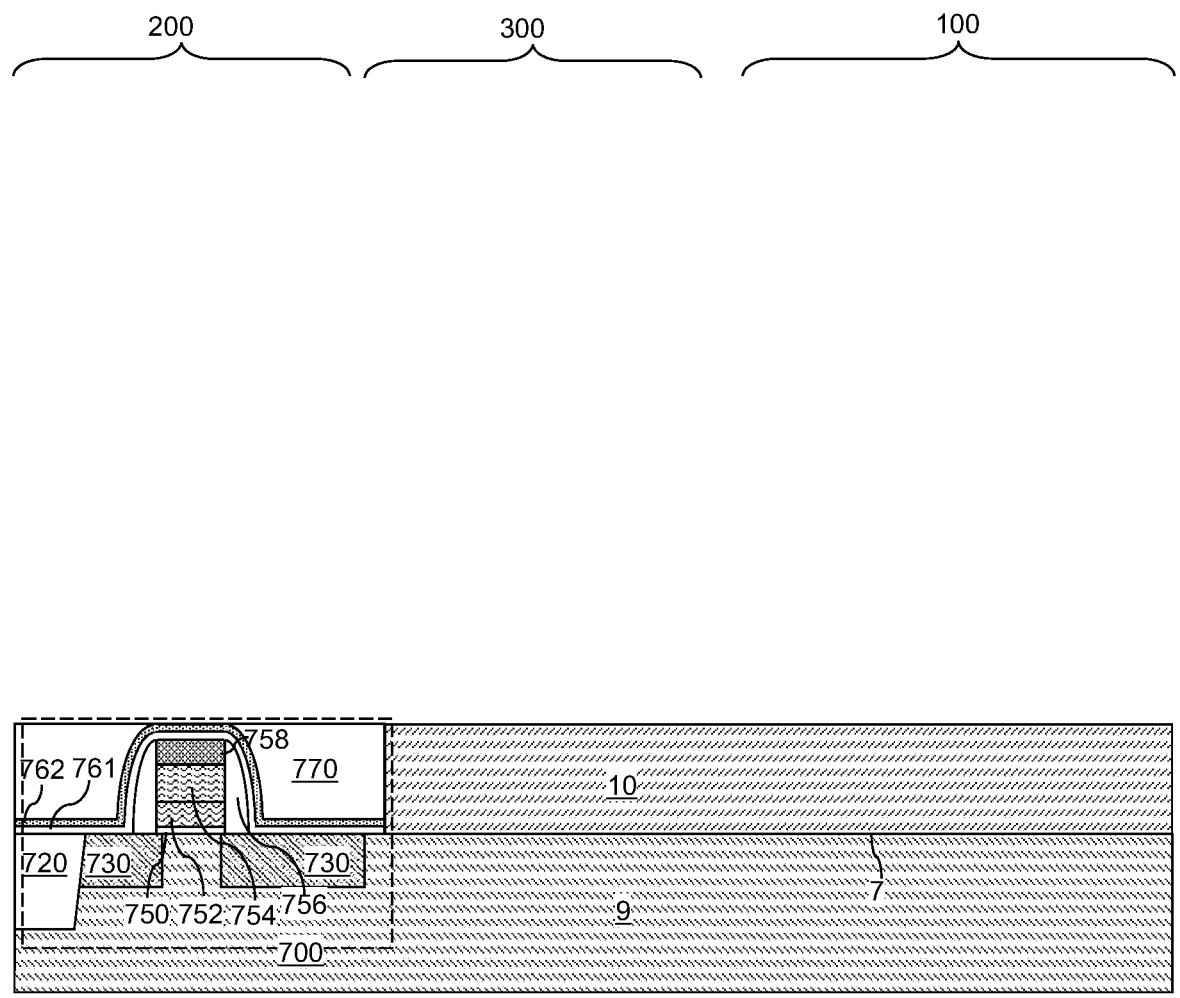
FIG. 1 is a schematic vertical cross-sectional view of a first exemplary structure after formation of at least one peripheral device, a semiconductor material layer, and a gate dielectric layer according to an embodiment of the present disclosure.

As discussed above, the present disclosure is directed to a three-dimensional memory device including aluminum alloy containing electrically conductive layers, such as word lines, and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of metal layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Referring to FIG. 2, an alternating stack of insulating layers 32 and aluminum layers 41 can be formed over the substrate (9, 10). Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. The insulating layers 32 can be deposited, for example, by chemical vapor deposition (CVD). For example, if silicon oxide is employed for the insulating layers 32, tetraethyl orthosilicate (TEOS) can be employed as the precursor material for the CVD process.

The aluminum layers 41 include aluminum at an atomic concentration greater than 95%, and/or greater than 98%, and/or greater than 99%, such as 98% to 100%. In one embodiment, the aluminum layers 41 may consist essentially of aluminum and unavoidable impurities. The aluminum layers 41 may be deposited by physical vapor deposition or by chemical vapor deposition.

The thicknesses of the insulating layers 32 and the aluminum layers 41 can be in a range from 20 nm to 50 nm, although lesser and greater thicknesses can be employed for each insulating layer 32 and for each aluminum layer 41. The number of repetitions of the pairs of an insulating layer 32 and a aluminum layer 41 can be in a range from 2 to 1,024, and typically from 8 to 256, although a greater number of repetitions can also be employed. In one embodiment, each aluminum layer 41 in the alternating stack (32, 41) can have a uniform thickness that is substantially invariant within each respective aluminum layer 41.

Optionally, an insulating cap layer 70 can be formed over the alternating stack (32, 41). In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at a peripheral region of the alternating stack (32, 41), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 41) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each aluminum layer 41 other than a topmost aluminum layer 41 within the alternating stack (32, 41) laterally extends farther than any overlying aluminum layer 41 within the alternating stack (32, 41) in the terrace region. The terrace region includes stepped surfaces of the alternating stack (32, 41) that continuously extend from a bottommost layer within the alternating stack (32, 41) to a topmost layer within the alternating stack (32, 41).

Each vertical step of the stepped surfaces can have the height of one or more pairs of an insulating layer 32 and an aluminum layer 41. In one embodiment, each vertical step can have the height of a single pair of an insulating layer 32 and a aluminum layer 41. In another embodiment, multiple "columns" of staircases can be formed along a first horizontal direction hd1 such that each vertical step has the height of a plurality of pairs of an insulating layer 32 and a aluminum layer 41, and the number of columns can be at least the number of the plurality of pairs. Each column of staircase can be vertically offset among one another such that each of the aluminum layers 41 has a physically exposed top surface in a respective column of staircases. In the illustrative example, two columns of staircases are formed for each block of memory stack structures to be subsequently formed such that one column of staircases provide physically exposed top surfaces for odd-numbered aluminum layers 41 (as counted from the bottom) and another column of staircases provide physically exposed top surfaces for even-numbered aluminum layers (as counted from the bottom). Configurations employing three, four, or more columns of staircases with a respective set of vertical offsets among the physically exposed surfaces of the aluminum layers 41 may also be employed. Each aluminum layer 41 has a greater lateral extent, at least along one direction, than any overlying aluminum layers 41 such that each physically exposed surface of any aluminum layer 41 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the aluminum layers 41 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
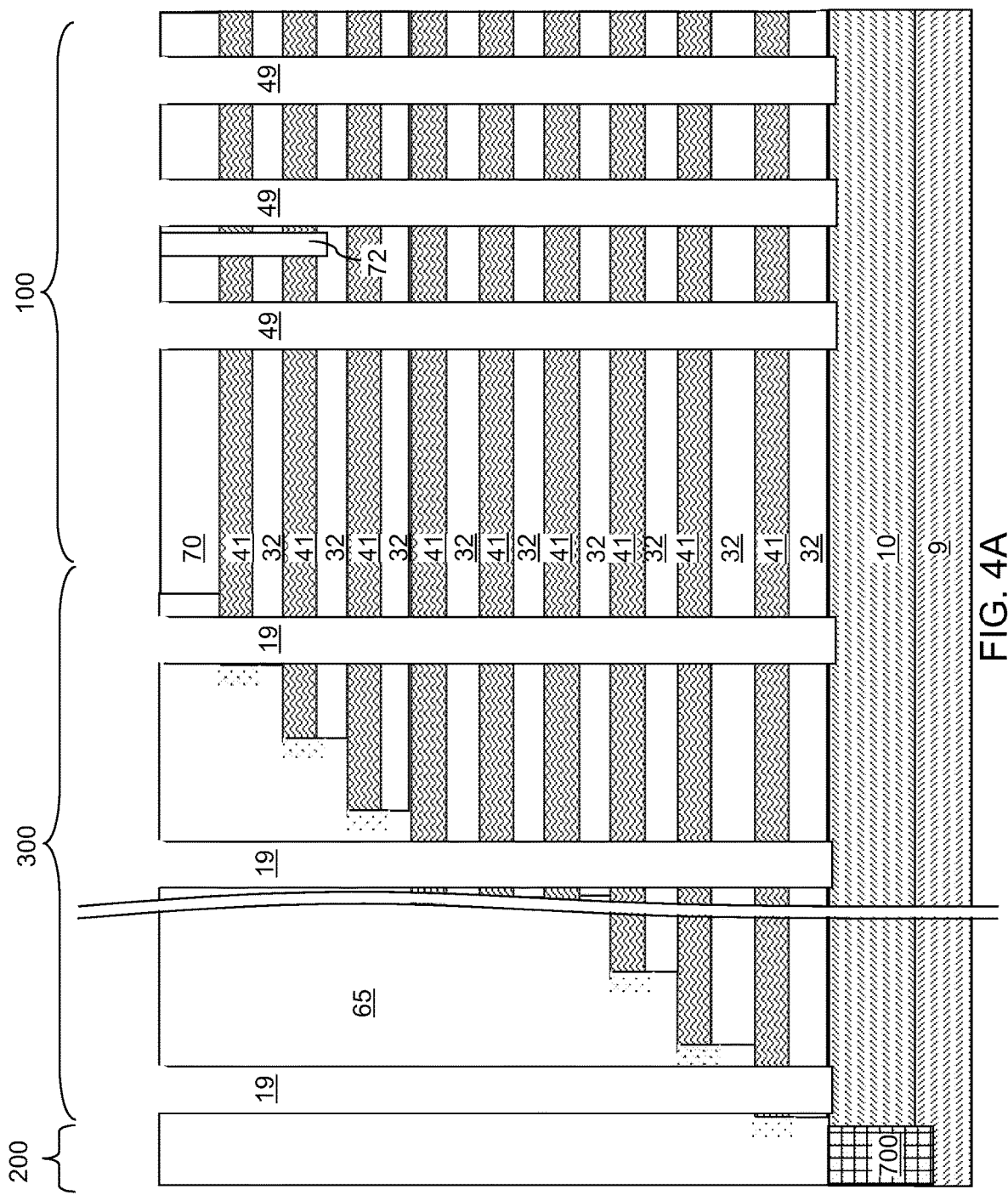
FIG. 4A is a schematic vertical cross-sectional view of the first exemplary structure after formation of memory openings and support openings according to an embodiment of the present disclosure.
Figure 4B:
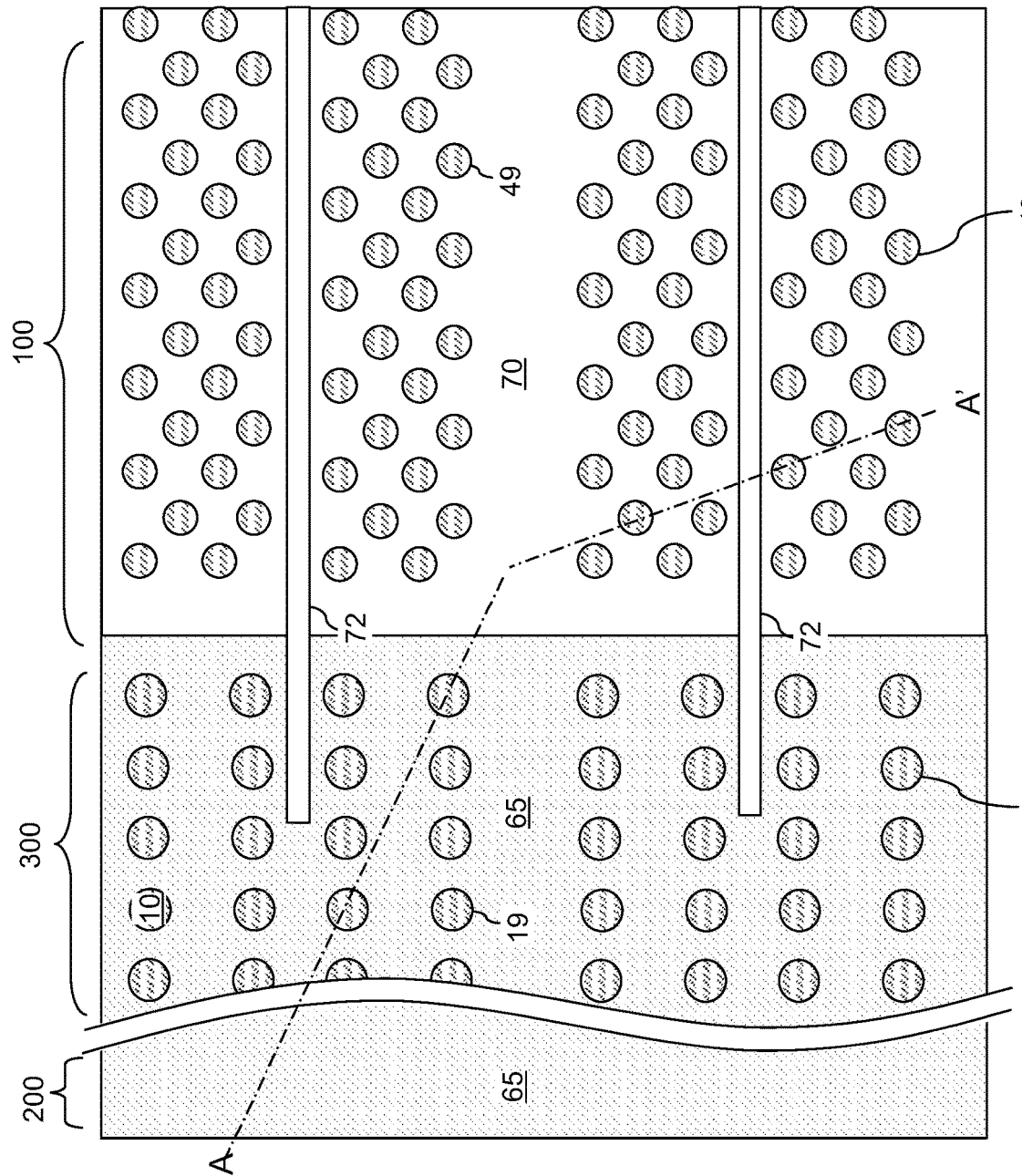
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 41) by at least one anisotropic etch that employs the patterned lithographic material stack as an etch mask. Portions of the alternating stack (32, 41) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 41) in the memory array region 100. The support openings 19 are formed through the retro-stepped dielectric material portion 65 and the portion of the alternating stack (32, 41) that underlie the stepped surfaces in the contact region 300.

The memory openings 49 extend through the entirety of the alternating stack (32, 41). The support openings 19 extend through a subset of layers within the alternating stack (32, 41). The chemistry of the anisotropic etch process employed to etch through the materials of the alternating stack (32, 41) can alternate to optimize etching of the first and second materials in the alternating stack (32, 41). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 41) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49, which is one of the memory openings 49 in the first exemplary structure of FIGS. 4A and 4B. The same structural change occurs simultaneously in each of the other memory openings 49 and in each support opening 19.

Figure 5B:
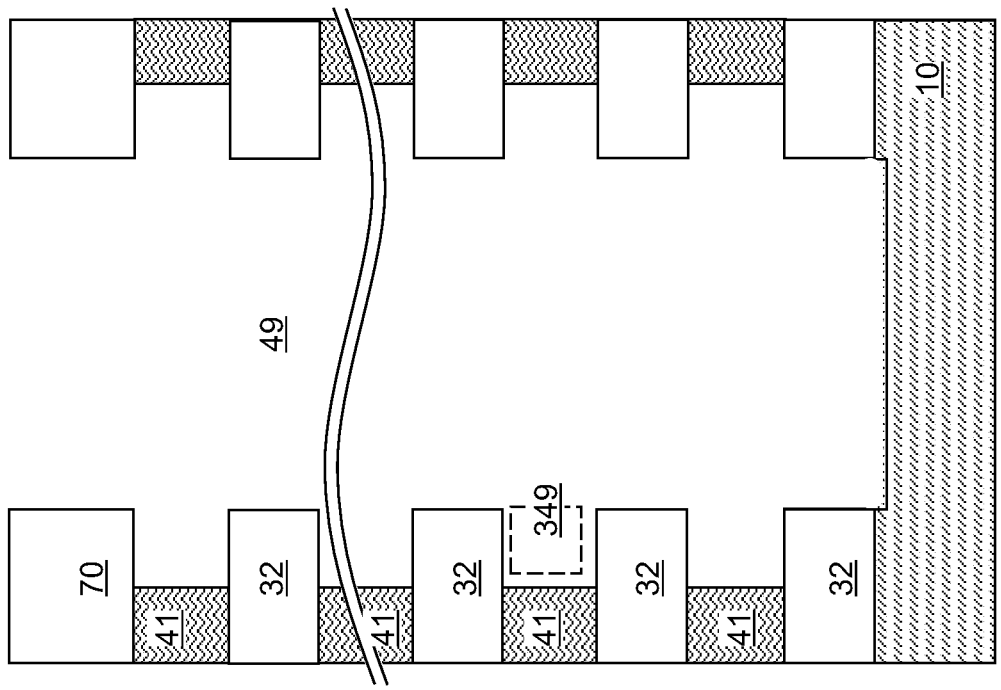
Figure 5A:
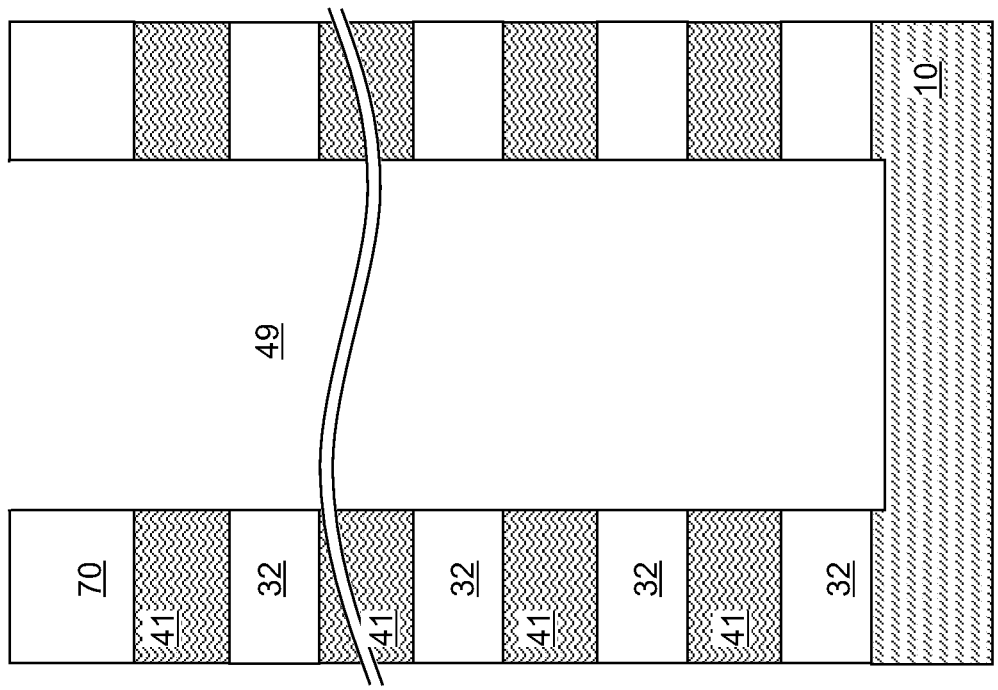

Referring to FIG. 5A, a memory opening 49 in the first exemplary structure of FIGS. 4A and 4B is illustrated. The memory opening 49 extends through the insulating cap layer 70, the alternating stack (32, 41), and optionally into an upper portion of the semiconductor material layer 10. At this processing step, each support opening 19 can extend through the retro-stepped dielectric material portion 65, a subset of layers in the alternating stack (32, 41), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the aluminum layers 41 can be laterally recessed partially to form lateral recesses (not shown), for example, by an isotropic etch.

Referring to FIG. 5B, an isotropic etch process that etches aluminum selective to the material of the insulating layers 32 and the insulating cap layer 70 can be performed to laterally recess physically exposed surfaces of the aluminum layers 41. For example, a wet etch process employing a mixture of phosphoric acid and nitric acid can be employed to laterally recess the physically exposed sidewalls of the aluminum layers 41 around each memory opening 49 and around each support opening 19. Lateral recesses 349 can be formed around the memory openings 49 and the support openings 19 by laterally recessing the aluminum layers 41 selective to the insulating layers 32. The lateral recess distance for the sidewalls of the aluminum layers 41 may be in a range from 10 nm to 80 nm, such as from 20 nm to 40 nm, although lesser and greater lateral recess distances may also be employed. Each of the lateral recesses 349 may have a toroidal configuration, i.e., an annular configuration. The recessed sidewalls of the aluminum layers 41 may be straight, and may be vertical.

Referring to FIG. 5C, annular metal portions 45 can be formed in the lateral recesses 349 by depositing at least one metal other than aluminum in the lateral recesses 349. According to an aspect of the present disclosure, the at least one metal other than aluminum can be selected from metal elements that form an intermetallic alloy with aluminum. In other words, the at least one metal other than aluminum can be a metal element that allows formation of an intermetallic alloy with aluminum in a respective phase diagram as known in the art. In one embodiment, the at least one metal may be selected from Ni, Ru, Fe, Co, Ti, Sc, Nb, Nd, or Cu. Preferably, the at least one metal forms a B2 phase alloy with aluminum, and may comprise Ni, Ru, Fe, Co or Ti. In one embodiment, the annular metal portions 45 may be formed by a selective metal deposition process that grows the at least one metal from physically exposed metallic surfaces (such as the sidewalls of the aluminum layers 41 at a nucleation step and from previously deposited segments of the annular metal portions 45 during a growth step) while suppressing growth of the at least one metal from surfaces of the insulating layers 32 and the insulating cap layer 70. In this case, a metal-organic precursor gas that decomposes and nucleates on metallic surfaces without nucleation on dielectric surfaces may be employed in a chemical vapor deposition process or in an atomic layer deposition process. Alternatively, a selective electroplating or electroless plating process for platable metals, such as Ni, Co or Cu may be used instead.

In one embodiment, the selective metal deposition process may be terminated such that inner sidewalls of the annular metal portions 45 are vertically coincident with a respective cylindrical vertical plane including sidewalls of the insulating layers 32 that are physically exposed to a respective memory opening 49 or to a respective support opening 19. In another embodiment, the selective metal deposition process may be terminated such that inner sidewalls of the annular metal portions 45 protrude from the lateral recesses 349 into peripheral volumes of a respective memory opening 49 or to a respective support opening 19. In this case, an anisotropic etch process may be performed to etch segments of the annular metal portions 45 that protrude into peripheral volumes of a respective memory opening 49 or to a respective support opening 19.

Referring to FIG. 5D, a stack of layers including an optional blocking dielectric layer 52, a memory material layer 54, and a dielectric material liner 56 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 10 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the blocking dielectric layer 52 can be in a range from 1 nm to 10 nm, although lesser and greater thicknesses can also be employed. In one embodiment, the blocking dielectric layer 52 may be a silicon oxide blocking dielectric layer consisting essentially of silicon oxide.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

Referring to FIG. 5E, an optional sacrificial cover material layer 601 may be conformally deposited over the dielectric material liner 56. The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5F, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the aluminum layers 41 constitutes a charge storage region.

A surface of the semiconductor material layer 10 can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls.

The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5G, a semiconductor channel layer 60L can be deposited directly on the semiconductor surface of the semiconductor material layer 10 and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5H, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5J, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In one embodiment, the vertical stack of memory elements comprises portions of a charge storage layer (comprising the memory material layer 54) located at the levels of the aluminum layers 41. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening 49.

Generally, a memory opening fill structure 58 can be formed on sidewalls of a vertical stack of annular metal portions 45 in each of the memory opening 49. The memory opening fill structure 58 comprises a vertical stack of memory elements (which may comprise portions of a memory material layer 54 located at levels of the aluminum layers 41) and a vertical semiconductor channel 60.

Figure 6A:
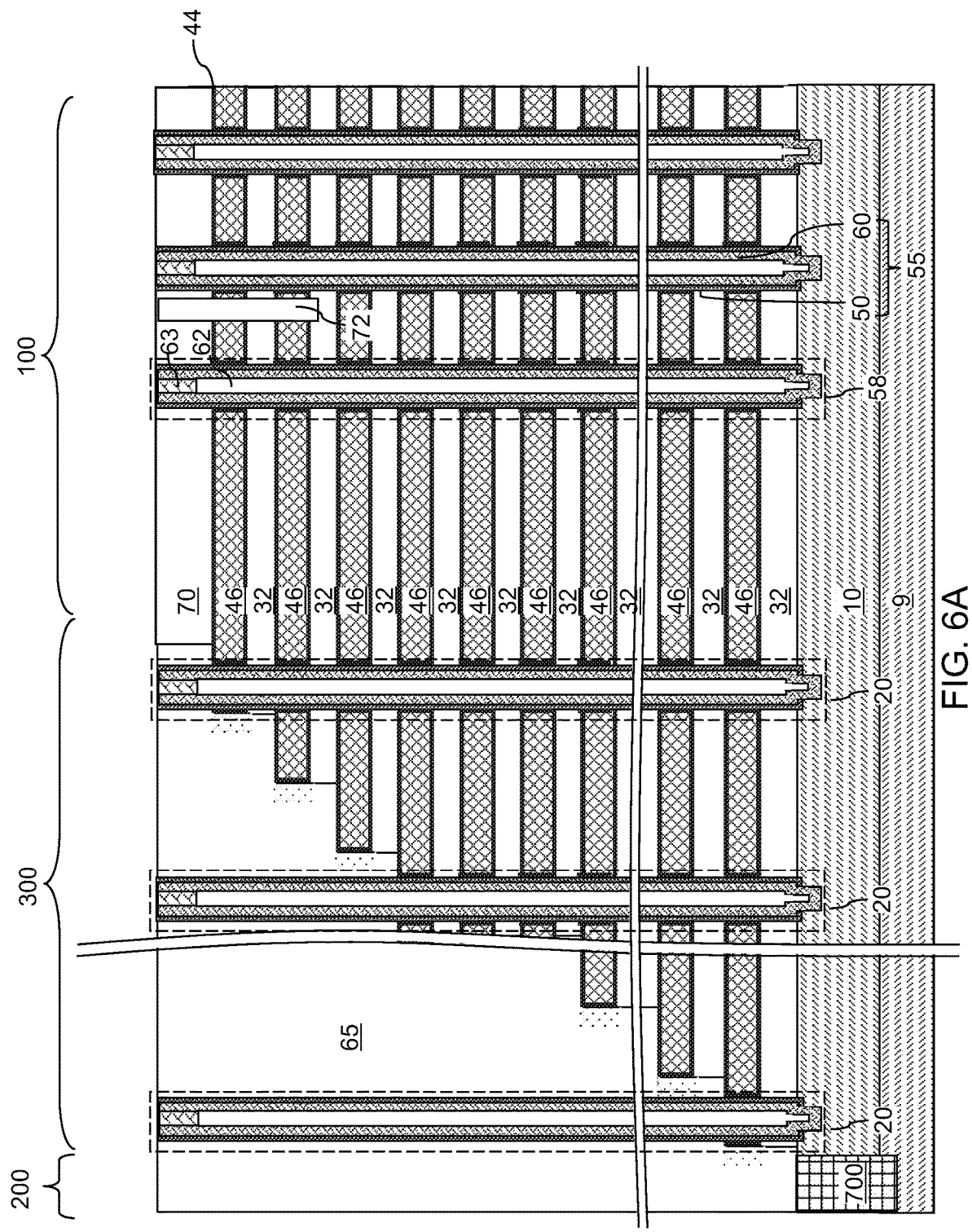
FIG. 6A is a schematic vertical cross-sectional view of the first exemplary structure after an anneal process that converts composite metal layers into electrically conductive layers including an intermetallic alloy of aluminum and at least one metal according to an embodiment of the present disclosure.
Figure 6B:
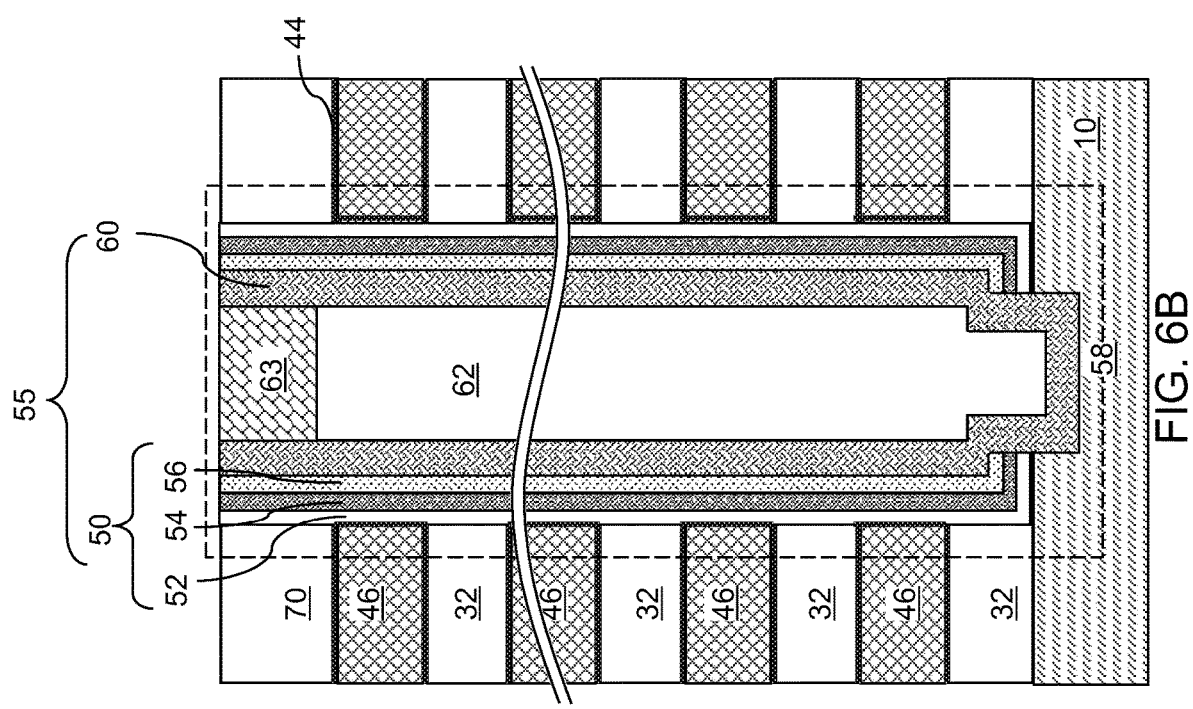
FIG. 6B is a magnified view of a region including a memory opening fill structure in the first exemplary structure of FIG. 6A.

Referring to FIGS. 6A and 6B, an anneal process can be performed at an elevated temperature to induce interdiffusion between aluminum in the aluminum layers 41 and the at least one metal other than aluminum in the annular metal portions 45. An electrically conductive layer 46 including a metal alloy of aluminum and the at least one metal other than aluminum is formed within the each contiguous volume of an aluminum layer 41 and annular metal portions 45 in contact with the aluminum layer 41. In one embodiment, the elevated temperature and the duration of the thermal anneal process may be selected such that the electrically conductive layers 46 are formed with a lateral compositional gradient. For example, the elevated temperature of the thermal anneal process may be in a range from 500 degrees Celsius to 800 degrees Celsius, and the duration of the thermal anneal process may be in a range from 10 minutes to 240 minutes. In case the electrically conductive layers 46 include a lateral compositional gradient, the lateral compositional gradient may be formed such that an atomic concentration of aluminum increases with a lateral distance from a most proximal one of the memory opening fill structures 58 due to the proximity of the annular metal portions 45 to the memory opening fill structures. Alternatively, the elevated temperature and the duration of the thermal anneal process may be selected such that the electrically conductive layers 46 have a homogeneous composition throughout.

Aluminum oxide liners 44 can be formed during the anneal process due to reaction of the aluminum atoms from the aluminum layers 41 with oxygen-containing material portions. For example, the insulating layers 32, the retro-stepped dielectric material portion 65, and optionally the blocking dielectric layer 52 or an outermost sub-layer within the blocking dielectric layer 52 may include an oxygen-containing dielectric material such as silicon oxide. In this case, the aluminum atoms from the aluminum layers 41 react with the oxygen atoms from oxygen-containing dielectric material portions to form the aluminum oxide liners (i.e., backside blocking dielectric layers) 44. The thickness of the aluminum oxide liners 44 depends on the temperature and the duration of the thermal anneal process and/or on the density and/or porosity of the dielectric oxide material, and may be in a range from 0.5 nm to 3 nm, such as from 1 nm to 2 nm, although lesser and greater thicknesses may also be employed. In one embodiment, an aluminum oxide liner 44 may include an upper horizontally-extending segment, a lower horizontally-extending segment, a plurality of vertical tubular segments laterally surrounding a respective memory opening fill structure 58 or a respective support pillar structure 20, and sidewall segments in contact with the retro-stepped dielectric material portion 65. Thus, the aluminum oxide liners 44 do not result in a significant thinning of the electrically conductive layers 46 and therefore, do not significantly increase the resistance of the electrically conductive layers 46. Furthermore, the electrically conductive layers 46 comprise an intermetallic material and do not require additional metal nitride liner/diffusion barrier layers between the electrically conductive layers 46 and the insulating layers 32. Thus, in one embodiment, metal nitride liner/diffusion barrier layers may be omitted. In contrast, prior art aluminum oxide backside blocking dielectrics are deposited in recesses between the insulating layers before the electrically conductive layers, and thus occupy part of the recesses space. Furthermore, prior art devices may include metal nitride liner/diffusion barrier layers deposited in recesses between the insulating layers before the electrically conductive layers are deposited in the recesses. Thus, the metal nitride liner/diffusion barrier layers also occupy part of the recesses space. Thus, the prior art electrically conductive layer thickness is decreased, which increases the resistance of the prior art electrically conductive layers. Furthermore, the prior art backside aluminum oxide blocking dielectrics and metal nitride liner/diffusion barrier layers require an extra layer deposition step, which increases the prior art process complexity and cost.

Figure 7A:
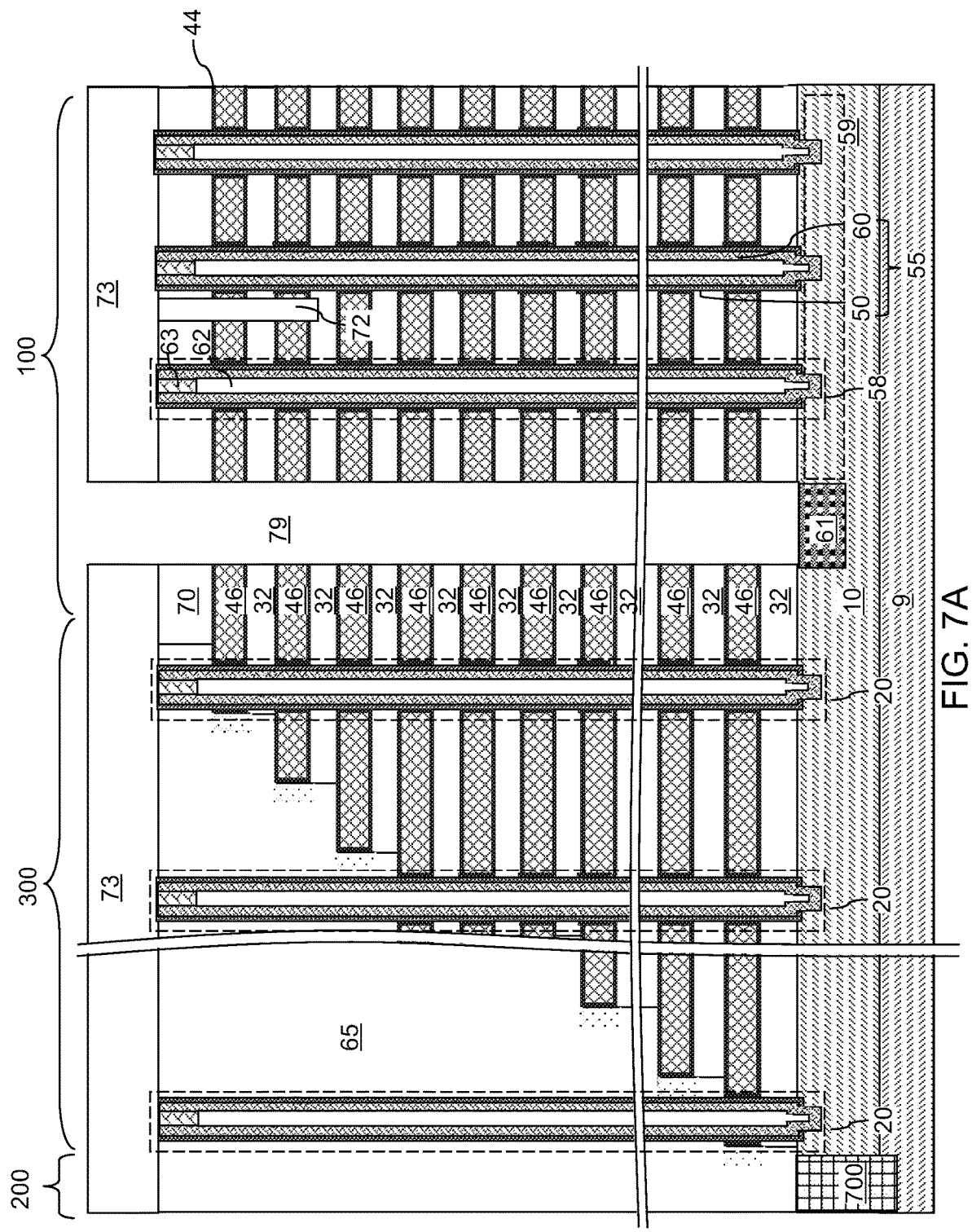
FIG. 7A is a schematic vertical cross-sectional view of the first exemplary structure after formation of backside trenches according to an embodiment of the present disclosure.

Referring to FIGS. 7A and 7B, a contact-level dielectric layer 73 can be formed over the alternating stack (32, 46) of insulating layer 32 and electrically conductive layers 46, and over the memory opening fill structures 58 and the support pillar structures 20. The contact-level dielectric layer 73 includes a dielectric material that is different from the dielectric material of the electrically conductive layers 46. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 46) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of memory opening fill structures 58 constitutes a horizontal semiconductor channel 59 for a plurality of field effect transistors. The horizontal semiconductor channel 59 is connected to multiple vertical semiconductor channels 60.

Figure 8:
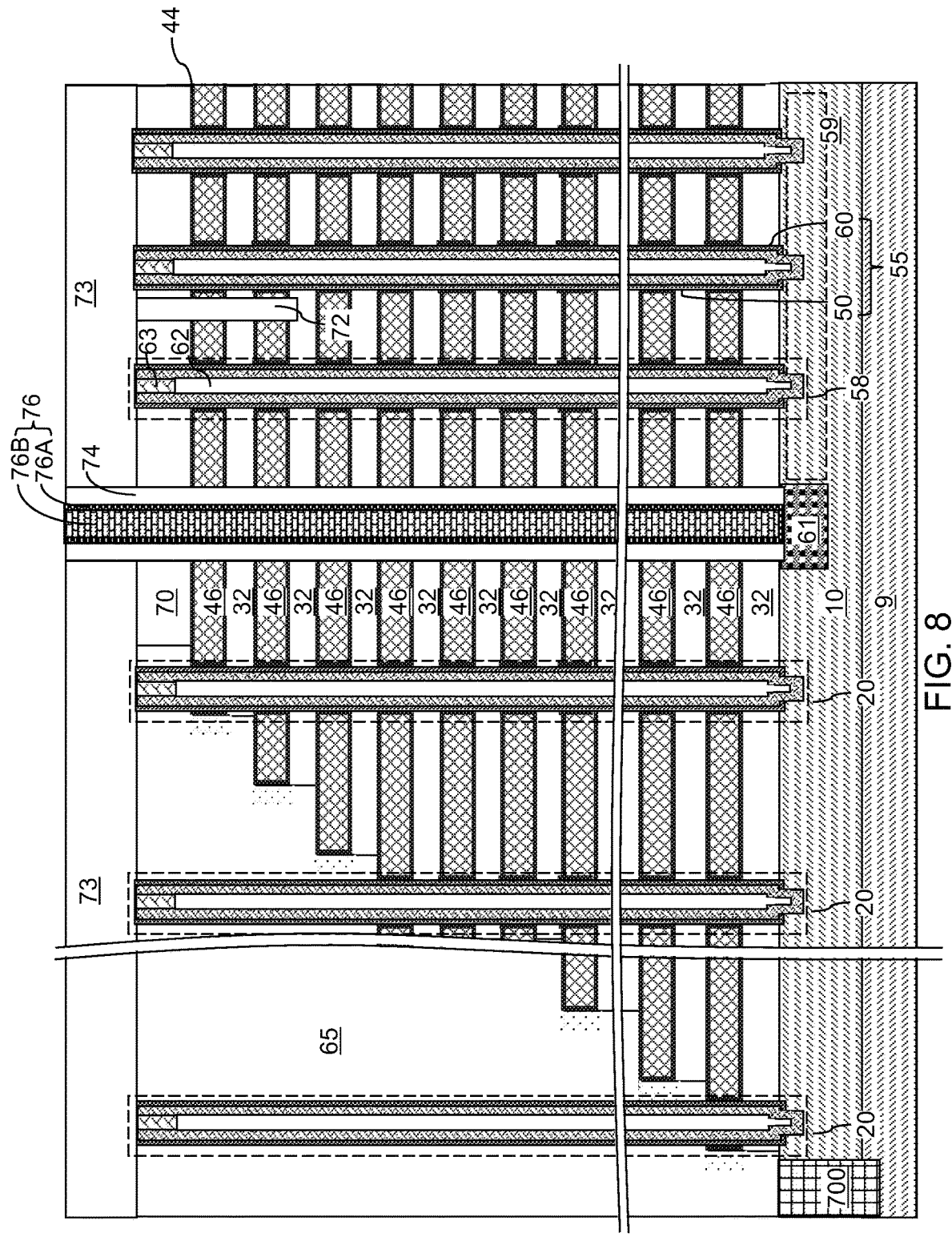
FIG. 8 is a schematic vertical cross-sectional view of the first exemplary structure after formation of backside trench fill structures according to an embodiment of the present disclosure.

Referring to FIG. 8, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. In one embodiment, the insulating material layer can be formed directly on surfaces of the aluminum oxide liners 44 and directly on the sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, MoN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

A thermal anneal process can be performed to activate electrical dopants in the source regions 61, the drain regions 63, and the vertical semiconductor channels 60. The elevated temperature of the thermal anneal process may be in a range from 900 degrees to 1,050 degrees Celsius, and the duration of the thermal anneal process may be in a range from 1 second to 10 minutes.

Figure 9A:
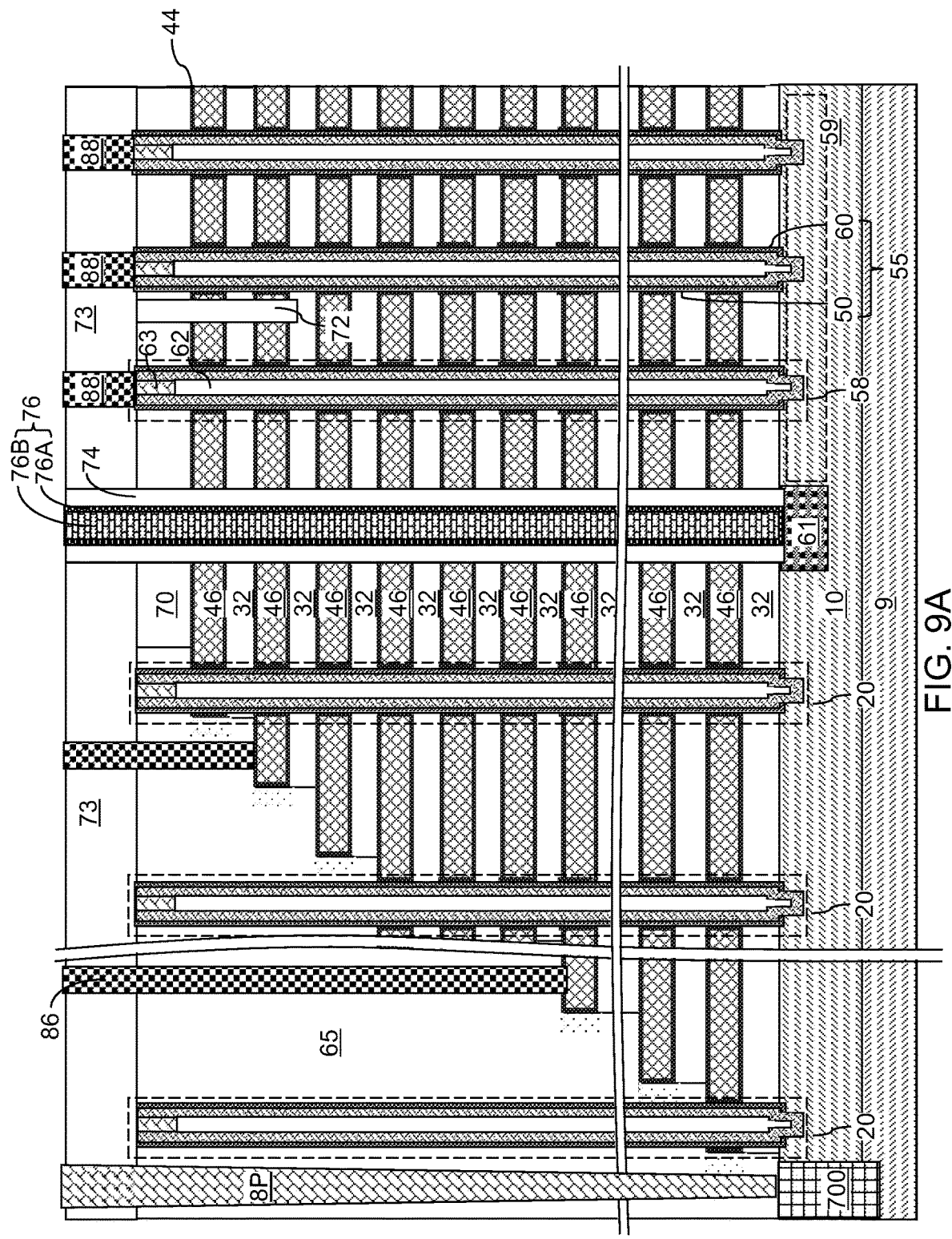
FIG. 9A is a schematic vertical cross-sectional view of the first exemplary structure after formation of additional contact via structures according to an embodiment of the present disclosure.
Figure 9B:
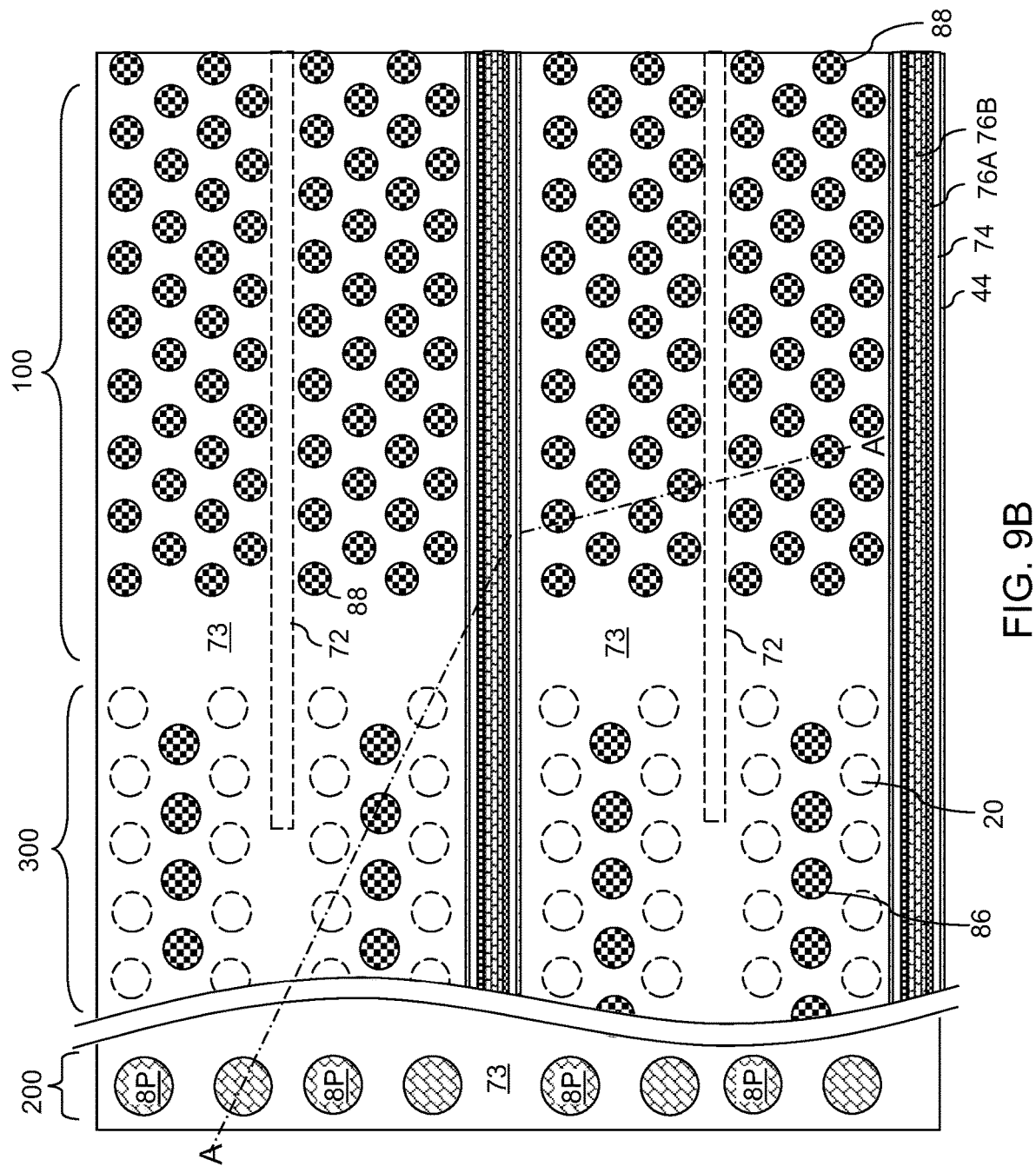
FIG. 9B is a top-down view of the first exemplary structure of FIG. 9A. The vertical plane A-A' is the plane of the schematic vertical cross-sectional view of FIG. 9A.

Referring to FIGS. 9A and 9B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

A second exemplary structure can be derived from the first exemplary structure of FIGS. 4A and 4B by modifying the structure of the memory opening fill structures 58 and the support pillar structures 20. FIGS. 10A-10H illustrate structural changes in a memory opening 49, which is one of the memory openings 49 during the processing steps that correspond to the processing steps of FIGS. 5A-5J. The same structural change occurs simultaneously in each of the other memory openings 49 and in each support opening 19.

Referring to FIG. 10A, a memory opening 49 in the second exemplary structure is illustrated, which can be the same as the memory opening in the first exemplary structure of FIGS. 4A, 4B, and 5A.

Referring to FIG. 10B, an isotropic etch process that etches aluminum selective to the material of the insulating layers 32 and the insulating cap layer 70 can be performed to laterally recess physically exposed surfaces of the aluminum layers 41. For example, a wet etch process employing a mixture of phosphoric acid and nitric acid can be employed to laterally recess the physically exposed sidewalls of the aluminum layers 41 around each memory opening 49 and around each support opening 19. Lateral recesses 349 can be formed around the memory openings 49 and the support openings 19 by laterally recessing the aluminum layers 41 selective to the insulating layers 32. The lateral recess distance for the sidewalls of the aluminum layers 41 may be in a range from 20 nm to 160 nm, such as from 40 nm to 80 nm, although lesser and greater lateral recess distances may also be employed. Each of the lateral recesses 349 may have a toroidal configuration, i.e., an annular configuration. The recessed sidewalls of the aluminum layers 41 may be straight, and may be vertical.

Referring to FIG. 10C, annular metal portions 45 can be formed in the lateral recesses 349 by depositing at least one metal other than aluminum in the lateral recesses 349. The same deposition process as the deposition process of FIG. 5C may be employed to form annular metal portions 45. For example, the annular metal portions 45 may be formed by a selective metal deposition process that grows the at least one metal from physically exposed metallic surfaces (such as the sidewalls of the aluminum layers 41 at a nucleation step and from previously deposited segments of the annular metal portions 45 during a growth step) while suppressing growth of the at least one metal from surfaces of the insulating layers 32 and the insulating cap layer 70.

In one embodiment, the selective metal deposition process may be terminated such that inner sidewalls of the annular metal portions 45 are laterally recessed outward from a cylindrical vertical plane including sidewalls of the insulating layers 32 that are physically exposed to a respective memory opening 49. In one embodiment, the lateral distance between an outer cylindrical sidewall and an inner cylindrical sidewall of each annular metal portion 45 may be in a range from 10 nm to 80 nm, such as from 20 nm to 40 nm, although lesser and greater lateral distances may also be employed. In one embodiment, the lateral distance between the inner sidewalls of the annular metal portions 45 relative to a most proximal cylindrical vertical plane including sidewalls of the insulating layers 32 laterally surrounding a respective memory opening 49 can be in a range from 10 nm to 80 nm, such as from 20 nm to 40 nm, although lesser and greater lateral distances may also be employed.

Referring to FIG. 10D, a blocking dielectric layer 52 can be deposited on the inner sidewalls of the annular metal portions 45 and on physically exposed surfaces of the insulating layers 32 around each memory opening 40. The blocking dielectric layer 52 can include any material that may be employed for the blocking dielectric layer 52 formed at the processing steps of FIG. 5D. The thickness of the blocking dielectric layer 52 can be in a range from 1 nm to 10 nm, although lesser and greater thicknesses can also be employed. In one embodiment, the blocking dielectric layer 52 may be a silicon oxide blocking dielectric layer consisting essentially of silicon oxide.

Referring to FIG. 10E, an anisotropic etch process may be performed to remove portions of the blocking dielectric layer 52 located outside the volumes of the lateral recesses 349 from inside the memory openings 49. Remaining portions of the blocking dielectric layer 52 in the lateral recesses comprise blocking dielectric portions 502. In one embodiment, each blocking dielectric portion 502 may comprise an upper annular blocking dielectric segment, a lower annular blocking dielectric segment, and a tubular blocking dielectric segment connecting an outer periphery of the upper annular blocking dielectric segment to an outer periphery of the lower annular blocking dielectric segment.

Referring to FIG. 10F, a memory material layer 54 can be formed over the vertical stacks of blocking dielectric portions 502 and sidewalls of the insulating layers 32. The memory material layer 54 may include any memory material that may be employed for the memory material layer 54 described with reference to FIG. 5D. In one embodiment, the memory material layer 54 can be deposited as a continuous material layer by a conformal deposition process such as a chemical vapor deposition process or an atomic layer deposition process. In one embodiment, the duration of the deposition process that deposits the memory material layer 54 may be selected such that all volumes of the lateral recesses 349 are filled with the vertical stacks of blocking dielectric portions 502 and portions of the memory material layer 54. Optionally, an isotropic etch back process may be performed to thin the vertically-extending portions of the memory material layer 54. Portions of the memory material layer 54 located at levels of the aluminum layers 41 constitute vertical stacks of memory elements. The lateral distance between an outer sidewall and an inner sidewall of the memory material layer 54 at levels of the aluminum layers 41 may be in a range from 10 nm to 80 nm, such as from 20 nm to 40 nm, although lesser and greater lateral distances may also be employed.

Figure 10H:
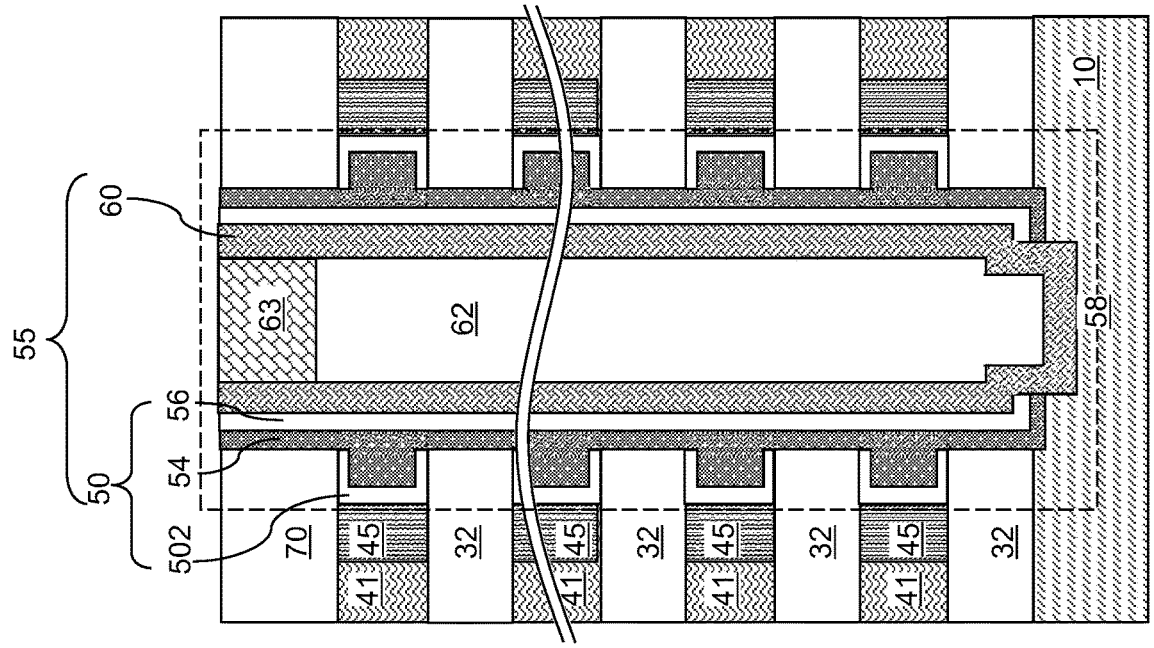
Figure 10G:
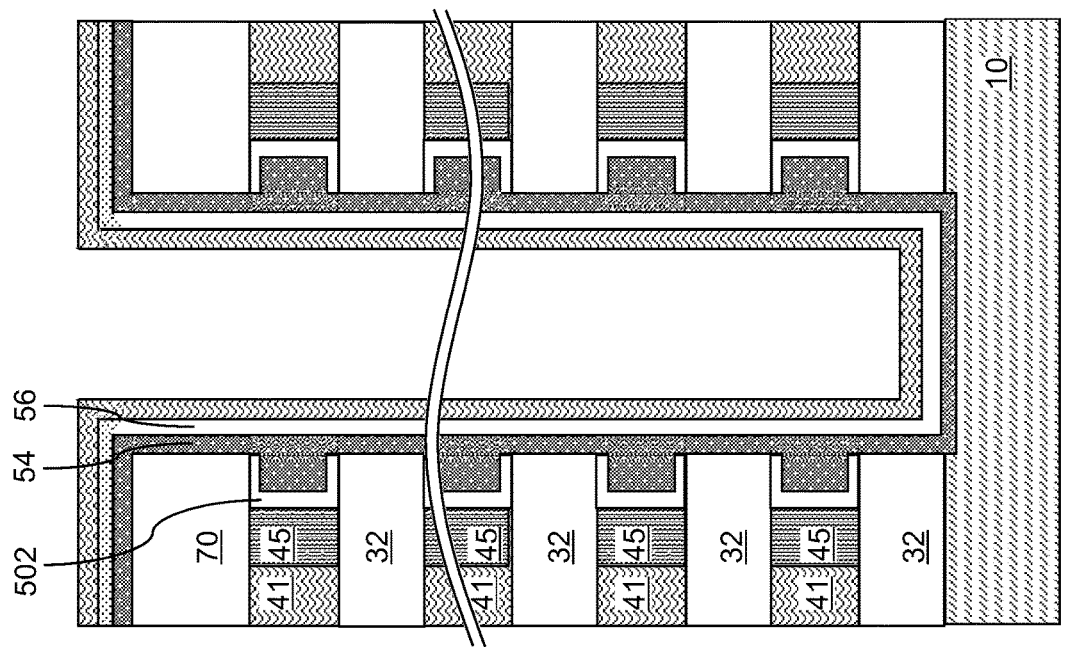

Referring to FIG. 10G, the processing steps of FIG. 5D can be performed to deposit a dielectric material liner 56 and an optional sacrificial cover material layer 601.

Referring to FIG. 10H, the processing steps of FIGS. 5E-5J can be performed to form a vertical semiconductor channel 60, a dielectric core 62, and a drain region 63 within each memory opening 49 and within each support opening 19. A memory opening fill structure 58 is formed in each memory opening 49, and a support pillar structure 20 is formed in each support opening 19.

Figure 11:
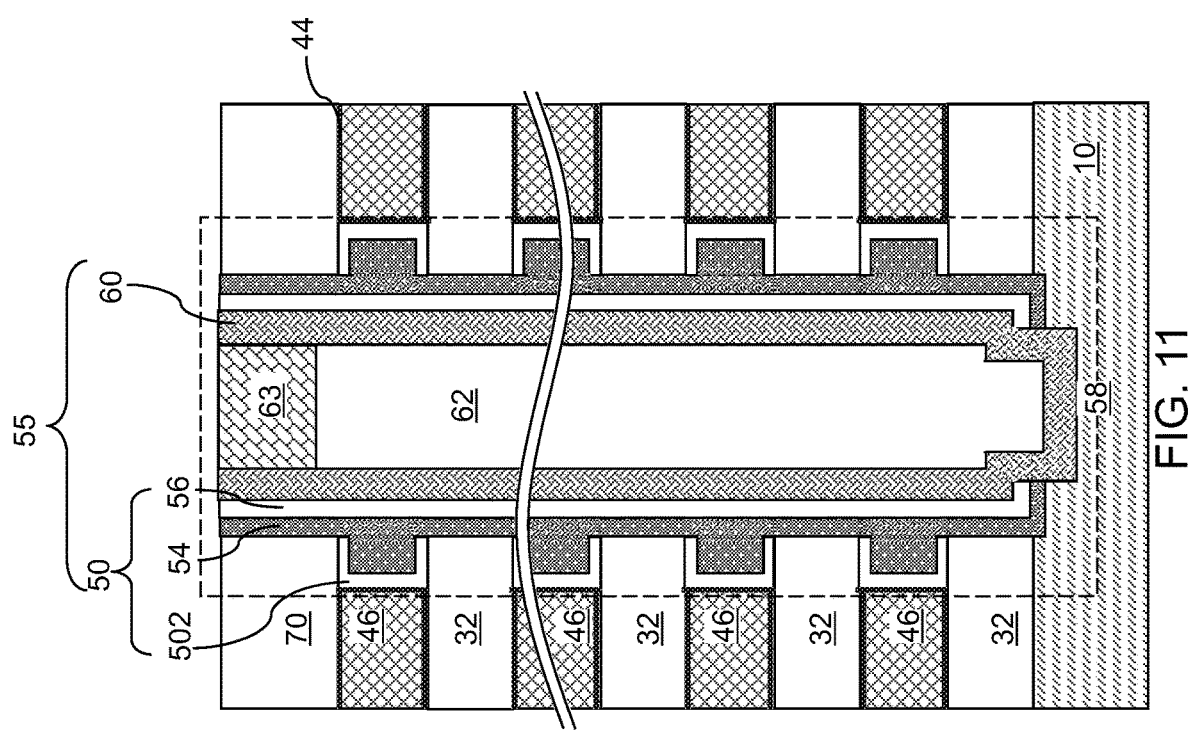
FIG. 11 is a schematic vertical cross-sectional view of a region of the second exemplary structure after an anneal process that converts composite metal layers into electrically conductive layers including an intermetallic alloy of aluminum and at least one metal according to an embodiment of the present disclosure.

Referring to FIG. 11, a thermal anneal process may be performed to convert each contiguous combination of an aluminum layer 41 and a plurality of annular metal portions 45 into a respective electrically conductive layer 46. In one embodiment, the elevated temperature and the duration of the thermal anneal process may be selected such that the electrically conductive layers 46 are formed with a lateral compositional gradient. In case the electrically conductive layers 46 include a lateral compositional gradient, the lateral compositional gradient may be formed such that an atomic concentration of aluminum increases with a lateral distance from a most proximal one of the memory opening fill structures 58 due to the proximity of the annular metal portions 45 to the memory opening fill structures. Alternatively, the elevated temperature and the duration of the thermal anneal process may be selected such that the electrically conductive layers 46 has a homogeneous composition throughout.

Aluminum oxide liners 44 can be formed during the anneal process due to reaction of the aluminum atoms from the aluminum layers 41 with oxygen-containing material portions. For example, the insulating layers 32, the retro-stepped dielectric material portion 65, and the blocking dielectric portions 502 may include an oxygen-containing dielectric material such as silicon oxide. In this case, the aluminum atoms from the aluminum layers 41 react with the oxygen atoms from oxygen-containing dielectric material portions to form the aluminum oxide liners 44. The thickness of the aluminum oxide liners 44 depends on the temperature and the duration of the thermal anneal process and/or on the density and/or porosity of the dielectric oxide material, and may be in a range from 0.5 nm to 3 nm, such as from 1 nm to 2 nm, although lesser and greater thicknesses may also be employed. In one embodiment, an aluminum oxide liner 44 may include an upper horizontally-extending segment, a lower horizontally-extending segment, a plurality of tubular segments laterally surrounding a respective memory opening fill structure 58 or a respective support pillar structure 20, and sidewall segments in contact with the retro-stepped dielectric material portion 65.

A third exemplary structure can be derived from the second exemplary structure by modifying the structure of the memory opening fill structures 58 and the support pillar structures 20. Specifically, the third exemplary structure can be derived from the second exemplary structure by dividing each memory material layer 54 in a respective memory opening fill structure 58 into a vertical stack of discrete memory elements 504. FIGS. 12A-12I illustrate structural changes in a memory opening 49, which is one of the memory openings 49 during the processing steps that correspond to the processing steps of FIGS. 5A-5J. The same structural change occurs simultaneously in each of the other memory openings 49 and in each support opening 19.

Referring to FIG. 12A, a memory opening 49 in the third exemplary structure is illustrated, which can be the same as the memory opening in the first exemplary structure of FIGS. 4A, 4B, and 5A.

Referring to FIG. 12B, an isotropic etch process that etches aluminum selective to the material of the insulating layers 32 and the insulating cap layer 70 can be performed to laterally recess physically exposed surfaces of the aluminum layers 41. For example, a wet etch process employing a mixture of phosphoric acid and nitric acid can be employed to laterally recess the physically exposed sidewalls of the aluminum layers 41 around each memory opening 49 and around each support opening 19. Lateral recesses 349 can be formed around the memory openings 49 and the support openings 19 by laterally recessing the aluminum layers 41 selective to the insulating layers 32. The lateral recess distance for the sidewalls of the aluminum layers 41 may be in a range from 20 nm to 160 nm, such as from 40 nm to 80 nm, although lesser and greater lateral recess distances may also be employed. Each of the lateral recesses 349 may have a toroidal configuration, i.e., an annular configuration. The recessed sidewalls of the aluminum layers 41 may be straight, and may be vertical.

Figure 12C:
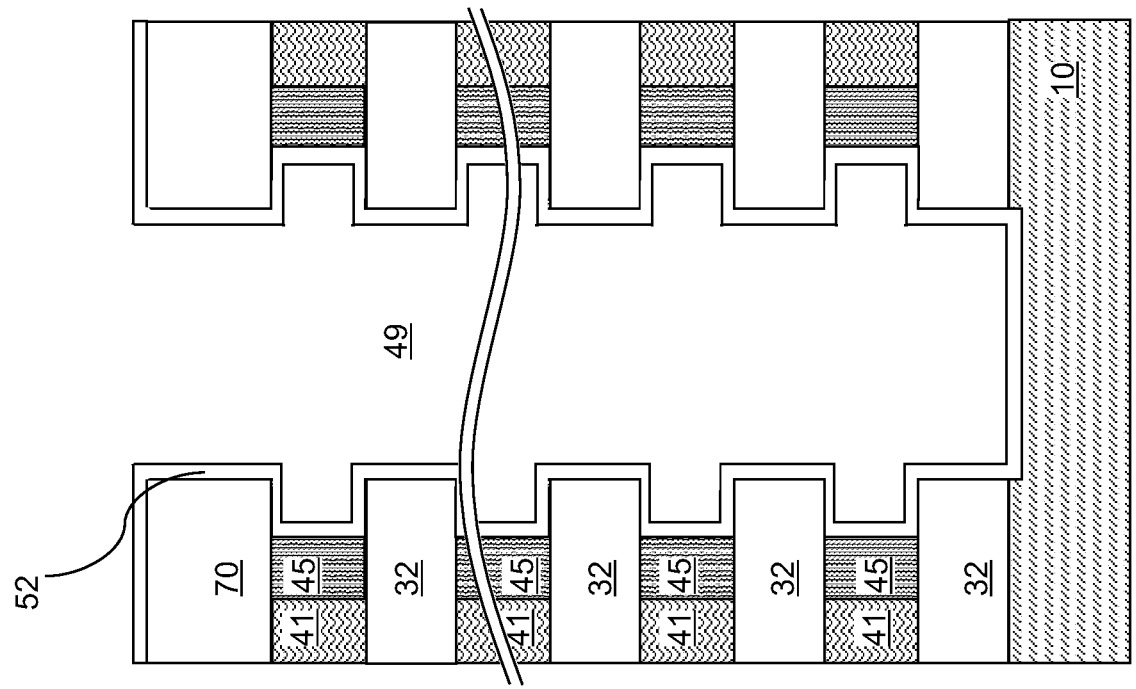

Referring to FIG. 12C, annular metal portions 45 can be formed in the lateral recesses 349 by depositing at least one metal other than aluminum in the lateral recesses 349. The same deposition process as the deposition process of FIG. 5C may be employed to form annular metal portions 45. For example, the annular metal portions 45 may be formed by a selective metal deposition process that grows the at least one metal from physically exposed metallic surfaces (such as the sidewalls of the aluminum layers 41 at a nucleation step and from previously deposited segments of the annular metal portions 45 during a growth step) while suppressing growth of the at least one metal from surfaces of the insulating layers 32 and the insulating cap layer 70.

In one embodiment, the selective metal deposition process may be terminated such that inner sidewalls of the annular metal portions 45 are laterally recessed outward from a cylindrical vertical plane including sidewalls of the insulating layers 32 that are physically exposed to a respective memory opening 49. In one embodiment, the lateral distance between an outer cylindrical sidewall and an inner cylindrical sidewall of each annular metal portion 45 may be in a range from 10 nm to 80 nm, such as from 20 nm to 40 nm, although lesser and greater lateral distances may also be employed. In one embodiment, the lateral distance between the inner sidewalls of the annular metal portions 45 relative to a most proximal cylindrical vertical plane including sidewalls of the insulating layers 32 laterally surrounding a respective memory opening 49 can be in a range from 10 nm to 80 nm, such as from 20 nm to 40 nm, although lesser and greater lateral distances may also be employed.

Figure 12D:
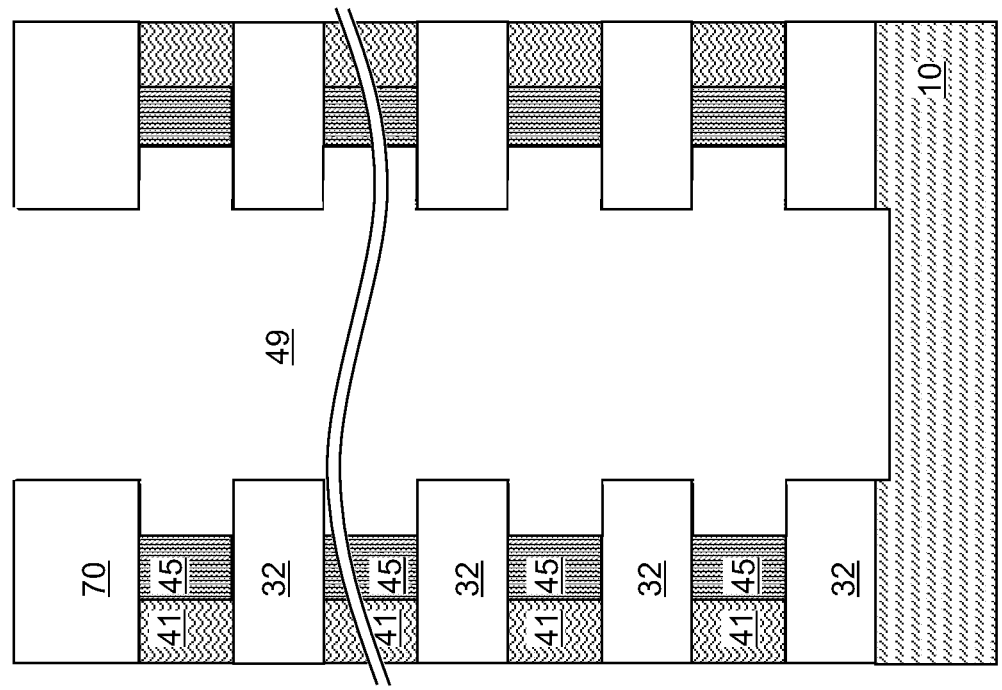

Referring to FIG. 12D, a blocking dielectric layer 52 can be deposited on the inner sidewalls of the annular metal portions 45 and on physically exposed surfaces of the insulating layers 32 around each memory opening 40. The blocking dielectric layer 52 can include any material that may be employed for the blocking dielectric layer 52 formed at the processing steps of FIG. 5D. The thickness of the blocking dielectric layer 52 can be in a range from 1 nm to 10 nm, although lesser and greater thicknesses can also be employed. In one embodiment, the blocking dielectric layer 52 may be a silicon oxide blocking dielectric layer consisting essentially of silicon oxide.

Referring to FIG. 12E, an anisotropic etch process may be performed to remove portions of the blocking dielectric layer 52 located outside the volumes of the lateral recesses 349 from inside the memory openings 49. Remaining portions of the blocking dielectric layer 52 in the lateral recesses comprise blocking dielectric portions 502. In one embodiment, each blocking dielectric portion 502 may comprise an upper annular blocking dielectric segment, a lower annular blocking dielectric segment, and a tubular blocking dielectric segment connecting an outer periphery of the upper annular blocking dielectric segment to an outer periphery of the lower annular blocking dielectric segment.

Referring to FIG. 12F, a memory material layer 54 can be formed over the vertical stacks of blocking dielectric portions 502 and sidewalls of the insulating layers 32. The memory material layer 54 may include any memory material that may be employed for the memory material layer 54 described with reference to FIG. 5D. In one embodiment, the memory material layer 54 can be deposited as a continuous material layer by a conformal deposition process such as a chemical vapor deposition process or an atomic layer deposition process. In one embodiment, the duration of the deposition process that deposits the memory material layer 54 may be selected such that all volumes of the lateral recesses 349 are filled with the vertical stacks of blocking dielectric portions 502 and portions of the memory material layer 54. Optionally, an isotropic etch back process may be performed to thin the vertically-extending portions of the memory material layer 54. Portions of the memory material layer 54 located at levels of the aluminum layers 41 constitute vertical stacks of memory elements. The lateral distance between an outer sidewall and an inner sidewall of the memory material layer 54 at levels of the aluminum layers 41 may be in a range from 10 nm to 80 nm, such as from 20 nm to 40 nm, although lesser and greater lateral distances may also be employed.

Referring to FIG. 12G, an anisotropic etch process can be performed to remove portions of the memory material layer 54 located outside the volumes of the lateral recesses 349 from inside the memory openings 49. The memory material layer 54 can be divided into vertical stacks of discrete memory elements 504. Each vertical stack of discrete memory elements 504 laterally surrounds a respective memory opening 49 or a respective support opening 19. Inner cylindrical sidewalls of a vertical stack of discrete memory elements 504 may be vertically coincident with a cylindrical vertical plane including sidewalls of the insulating layers 32 that laterally surround a memory opening 49.

Referring to FIG. 12H, the processing steps of FIG. 5D can be performed to deposit a dielectric material liner 56 and an optional sacrificial cover material layer 601.

Figure 12I:
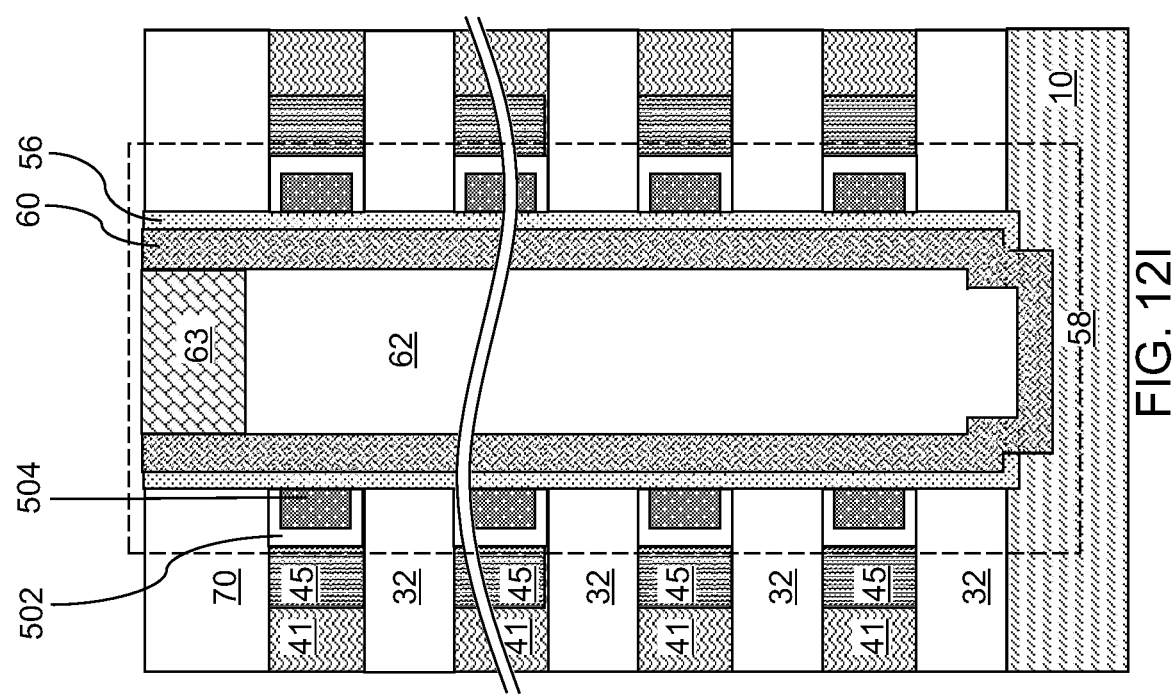

Referring to FIG. 12I, the processing steps of FIGS. 5E-5J can be performed to form a vertical semiconductor channel 60, a dielectric core 62, and a drain region 63 within each memory opening 49 and within each support opening 19. A memory opening fill structure 58 is formed in each memory opening 49, and a support pillar structure 20 is formed in each support opening 19.

Figure 13:
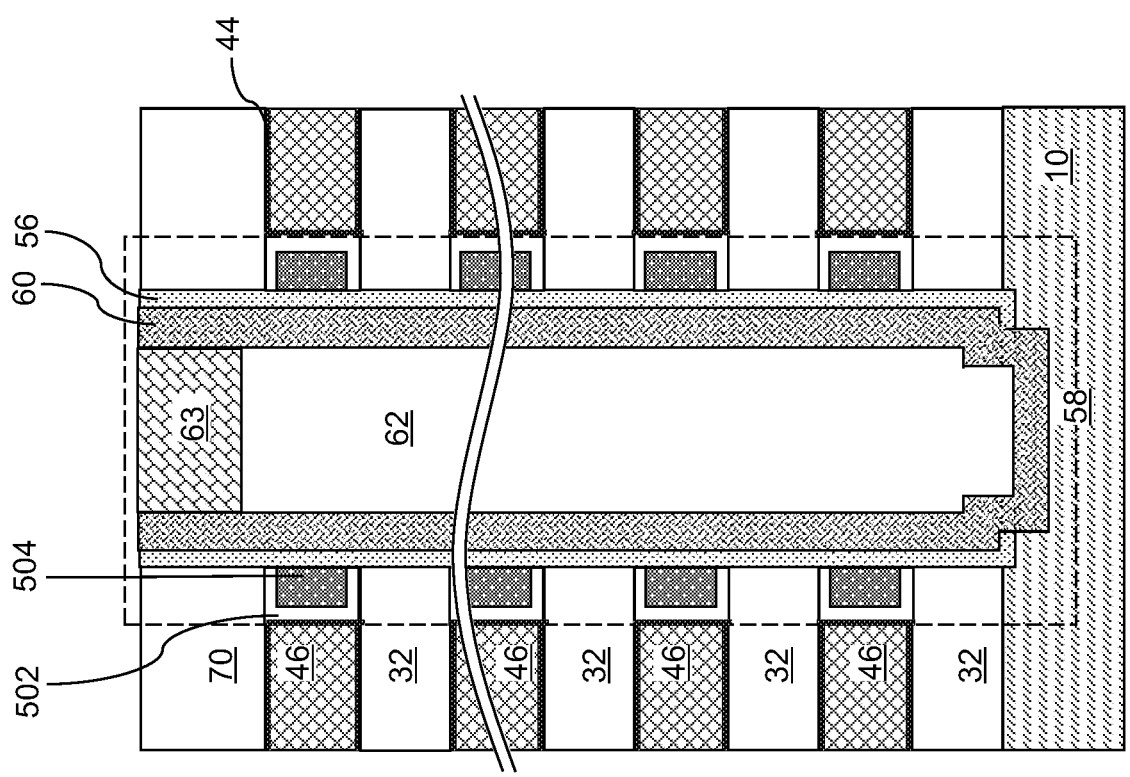
FIG. 13 is a schematic vertical cross-sectional view of a region of the third exemplary structure after an anneal process that converts composite metal layers into electrically conductive layers including an intermetallic alloy of aluminum and at least one metal according to an embodiment of the present disclosure.

Referring to FIG. 13, a thermal anneal process may be performed to convert each contiguous combination of an aluminum layer 41 and a plurality of annular metal portions 45 into a respective electrically conductive layer 46. In one embodiment, the elevated temperature and the duration of the thermal anneal process may be selected such that the electrically conductive layers 46 are formed with a lateral compositional gradient. In case the electrically conductive layers 46 include a lateral compositional gradient, the lateral compositional gradient may be formed such that an atomic concentration of aluminum increases with a lateral distance from a most proximal one of the memory opening fill structures 58 due to the proximity of the annular metal portions 45 to the memory opening fill structures. Alternatively, the elevated temperature and the duration of the thermal anneal process may be selected such that the electrically conductive layers 46 has a homogeneous composition throughout.

Aluminum oxide liners 44 can be formed during the anneal process due to reaction of the aluminum atoms from the aluminum layers 41 with oxygen-containing material portions. For example, the insulating layers 32, the retro-stepped dielectric material portion 65, and the blocking dielectric portions 502 may include an oxygen-containing dielectric material such as silicon oxide. In this case, the aluminum atoms from the aluminum layers 41 react with the oxygen atoms from oxygen-containing dielectric material portions to form the aluminum oxide liners 44. The thickness of the aluminum oxide liners 44 depends on the temperature and the duration of the thermal anneal process and/or on the density and/or porosity of the dielectric oxide material, and may be in a range from 0.5 nm to 3 nm, such as from 1 nm to 2 nm, although lesser and greater thicknesses may also be employed. In one embodiment, an aluminum oxide liner 44 may include an upper horizontally-extending segment, a lower horizontally-extending segment, a plurality of tubular segments laterally surrounding a respective memory opening fill structure 58 or a respective support pillar structure 20, and sidewall segments in contact with the retro-stepped dielectric material portion 65.

A fourth exemplary structure can be derived from the first, second or third exemplary structures by modifying the structure of the memory opening fill structures 58 and the support pillar structures 20. Specifically, the fourth exemplary structure can be derived from the third exemplary structure by employing a combination of a vertical stack of dielectric metal oxide blocking dielectric portions 501 and a vertical stack of silicon oxide blocking dielectric portions 503 in lieu of a vertical stack of blocking dielectric portions 502 in each memory opening fill structure 58 and in each support pillar structure 20.

The additional dielectric metal oxide blocking dielectric portions 501 increase the thickness of blocking dielectric in case that the thickness of the blocking dielectric portions 503 or the blocking dielectric layer 52 is not sufficiently thick to perform the backside tunneling blocking function. Thus, the additional dielectric metal oxide blocking dielectric portions 501 may be used in any embodiment or structure of the present disclosure. FIGS. 14A-14I illustrate structural changes in a memory opening 49, which is one of the memory openings 49 during the processing steps that correspond to the processing steps of FIGS. 5A-5J. The same structural change occurs simultaneously in each of the other memory openings 49 and in each support opening 19.

Referring to FIG. 14A, a memory opening 49 in the fourth exemplary structure is illustrated, which can be the same as the memory opening in the first exemplary structure of FIGS. 4A, 4B, and 5A.

Referring to FIG. 14B, an isotropic etch process that etches aluminum selective to the material of the insulating layers 32 and the insulating cap layer 70 can be performed to laterally recess physically exposed surfaces of the aluminum layers 41. For example, a wet etch process employing a mixture of phosphoric acid and nitric acid can be employed to laterally recess the physically exposed sidewalls of the aluminum layers 41 around each memory opening 49 and around each support opening 19. Lateral recesses 349 can be formed around the memory openings 49 and the support openings 19 by laterally recessing the aluminum layers 41 selective to the insulating layers 32. The lateral recess distance for the sidewalls of the aluminum layers 41 may be in a range from 20 nm to 160 nm, such as from 40 nm to 80 nm, although lesser and greater lateral recess distances may also be employed. Each of the lateral recesses 349 may have a toroidal configuration, i.e., an annular configuration. The recessed sidewalls of the aluminum layers 41 may be straight, and may be vertical.

Figures 14C, 14D:
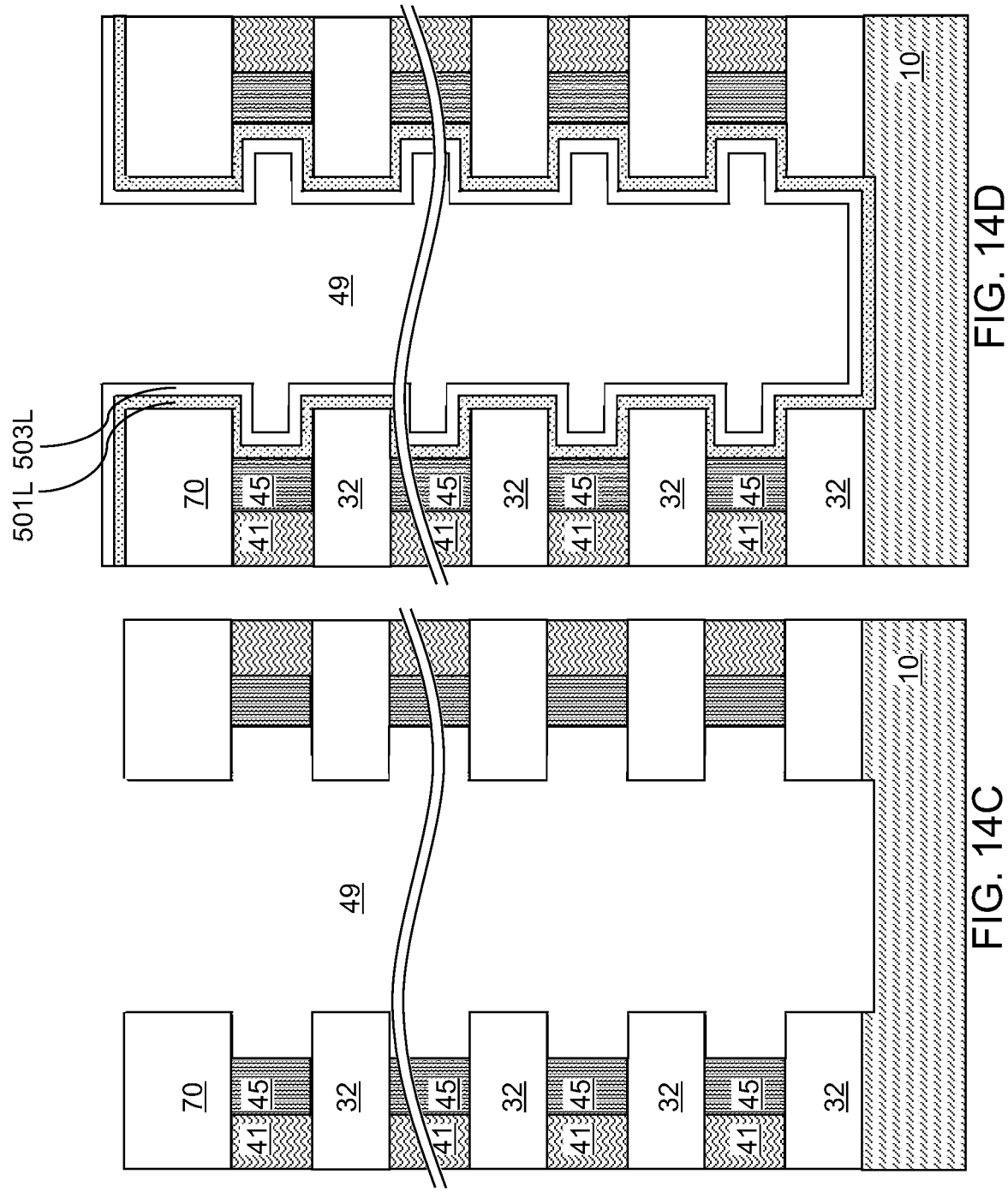

Referring to FIG. 14C, annular metal portions 45 can be formed in the lateral recesses 349 by depositing at least one metal other than aluminum in the lateral recesses 349. The same deposition process as the deposition process of FIG. 5C may be employed to form annular metal portions 45. For example, the annular metal portions 45 may be formed by a selective metal deposition process that grows the at least one metal from physically exposed metallic surfaces (such as the sidewalls of the aluminum layers 41 at a nucleation step and from previously deposited segments of the annular metal portions 45 during a growth step) while suppressing growth of the at least one metal from surfaces of the insulating layers 32 and the insulating cap layer 70.

In one embodiment, the selective metal deposition process may be terminated such that inner sidewalls of the annular metal portions 45 are laterally recessed outward from a cylindrical vertical plane including sidewalls of the insulating layers 32 that are physically exposed to a respective memory opening 49. In one embodiment, the lateral distance between an outer cylindrical sidewall and an inner cylindrical sidewall of each annular metal portion 45 may be in a range from 10 nm to 80 nm, such as from 20 nm to 40 nm, although lesser and greater lateral distances may also be employed. In one embodiment, the lateral distance between the inner sidewalls of the annular metal portions 45 relative to a most proximal cylindrical vertical plane including sidewalls of the insulating layers 32 laterally surrounding a respective memory opening 49 can be in a range from 10 nm to 80 nm, such as from 20 nm to 40 nm, although lesser and greater lateral distances may also be employed.

Referring to FIG. 14D, a dielectric metal oxide blocking dielectric layer 50IL and a silicon oxide blocking dielectric layer 503L can be deposited over the inner sidewalls of the annular metal portions 45 and over physically exposed surfaces of the insulating layers 32 around each memory opening 40. The dielectric metal oxide blocking dielectric layer 50IL includes a dielectric metal oxide material such as aluminum oxide, lanthanum oxide, yttrium oxide, hafnium oxide, titanium oxide, tantalum oxide, etch. The thickness of the dielectric metal oxide blocking dielectric layer 50IL can be in a range from 1 nm to 10 nm, although lesser and greater thicknesses may also be employed. The silicon oxide blocking dielectric layer 503L includes, and/or consists essentially of, silicon oxide. The thickness of the silicon oxide blocking dielectric layer 503L can be in a range from 1 nm to 10 nm, although lesser and greater thicknesses can also be employed.

Figure 14F:
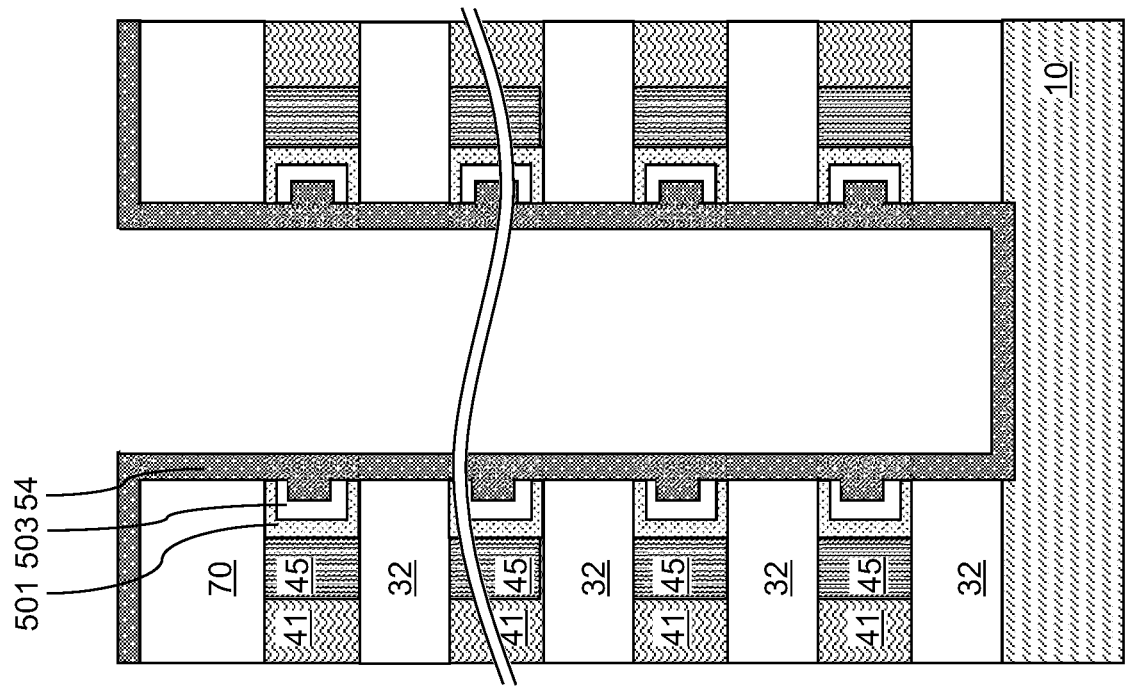
Figure 14E:
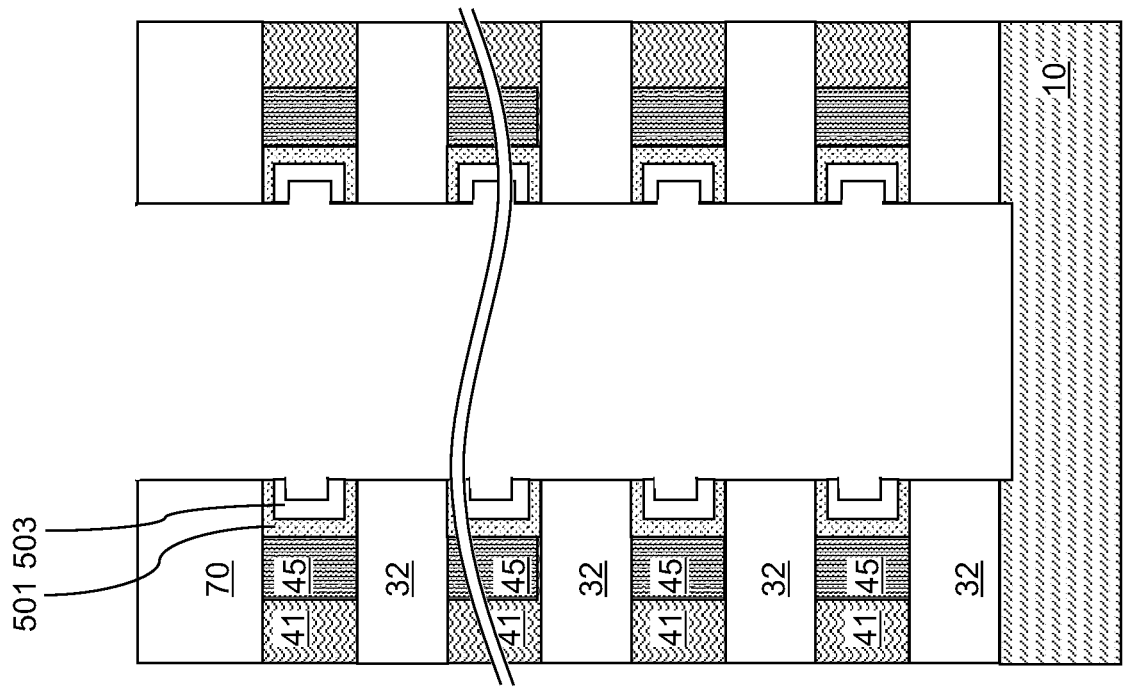

Referring to FIG. 14E, an anisotropic etch process may be performed to remove portions of the dielectric metal oxide blocking dielectric layer 50IL and the silicon oxide blocking dielectric layer 503L located outside the volumes of the lateral recesses 349 from inside the memory openings 49. Remaining portions of the dielectric metal oxide blocking dielectric layer 50IL in the lateral recesses 349 comprise dielectric metal oxide blocking dielectric portions 501. In one embodiment, each dielectric metal oxide blocking dielectric portion 501 may comprise an upper annular dielectric metal oxide blocking dielectric segment, a lower annular dielectric metal oxide blocking dielectric segment, and a tubular dielectric metal oxide blocking dielectric segment connecting an outer periphery of the upper annular dielectric metal oxide blocking dielectric segment to an outer periphery of the lower annular dielectric metal oxide blocking dielectric segment. Remaining portions of the silicon oxide blocking dielectric layer 503L in the lateral recesses 349 comprise silicon oxide blocking dielectric portions 503. In one embodiment, each silicon oxide blocking dielectric portion 503 may comprise an upper annular silicon oxide blocking dielectric segment, a lower annular silicon oxide blocking dielectric segment, and a tubular silicon oxide blocking dielectric segment connecting an outer periphery of the upper annular silicon oxide blocking dielectric segment to an outer periphery of the lower annular silicon oxide blocking dielectric segment.

Referring to FIG. 14F, a memory material layer 54 can be formed over the vertical stacks of dielectric metal oxide blocking dielectric portions 501 and the vertical stacks of the silicon oxide blocking dielectric portions 503 and sidewalls of the insulating layers 32. The memory material layer 54 may include any memory material that may be employed for the memory material layer 54 described with reference to FIG. 5D. In one embodiment, the memory material layer 54 can be deposited as a continuous material layer by a conformal deposition process such as a chemical vapor deposition process or an atomic layer deposition process. In one embodiment, the duration of the deposition process that deposits the memory material layer 54 may be selected such that all volumes of the lateral recesses 349 are filled with the vertical stacks of dielectric metal oxide blocking dielectric portions 501, the vertical stacks of the silicon oxide blocking dielectric portions 503, and portions of the memory material layer 54. Optionally, an isotropic etch back process may be performed to thin the vertically-extending portions of the memory material layer 54. Portions of the memory material layer 54 located at levels of the aluminum layers 41 constitute vertical stacks of memory elements. The lateral distance between an outer sidewall and an inner sidewall of the memory material layer 54 at levels of the aluminum layers 41 may be in a range from 10 nm to 80 nm, such as from 20 nm to 40 nm, although lesser and greater lateral distances may also be employed.

Figure 14G:
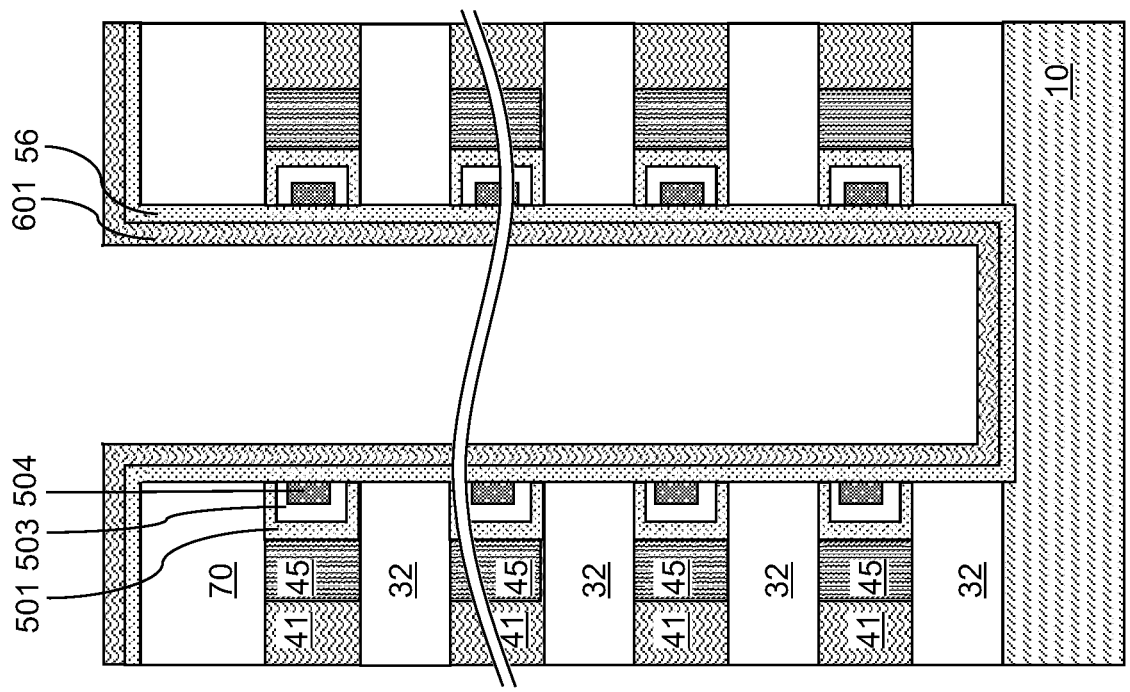

Referring to FIG. 14G, an anisotropic etch process can be performed to remove portions of the memory material layer 54 located outside the volumes of the lateral recesses 349 from inside the memory openings 49. The memory material layer 54 can be divided into vertical stacks of discrete memory elements 504. Each vertical stack of discrete memory elements 504 laterally surrounds a respective memory opening 49 or a respective support opening 19. Inner cylindrical sidewalls of a vertical stack of discrete memory elements 504 may be vertically coincident with a cylindrical vertical plane including sidewalls of the insulating layers 32 that laterally surround a memory opening 49.

Figure 14H:
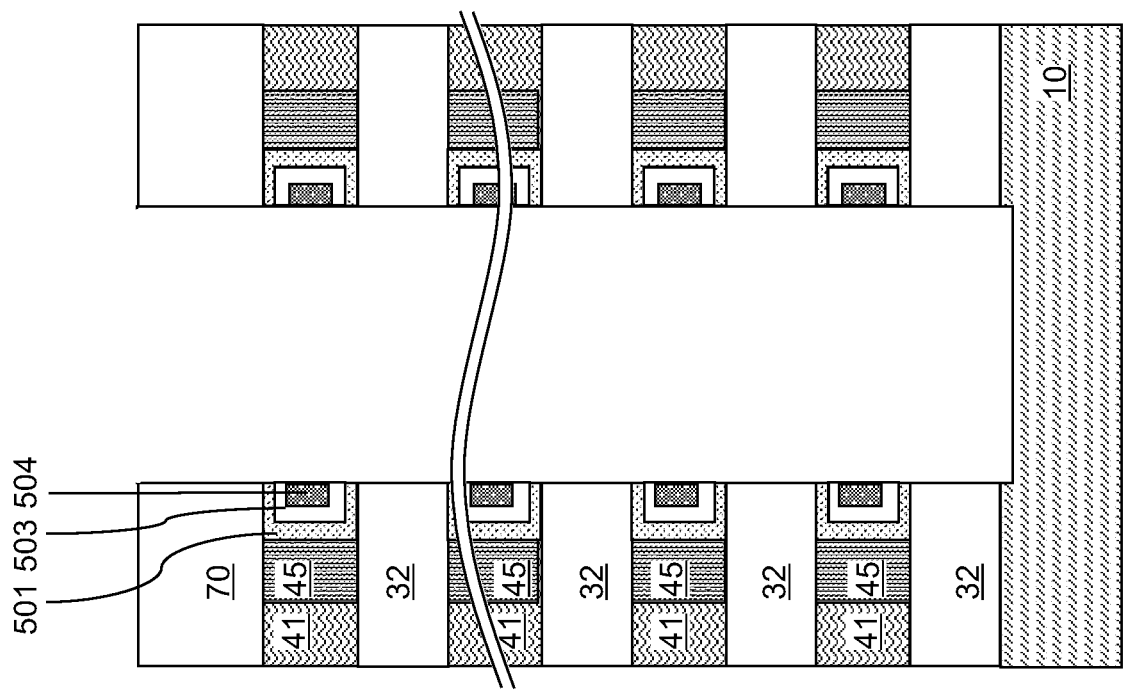

Referring to FIG. 14H, the processing steps of FIG. 5D can be performed to deposit a dielectric material liner 56 and an optional sacrificial cover material layer 601.

Figure 14I:
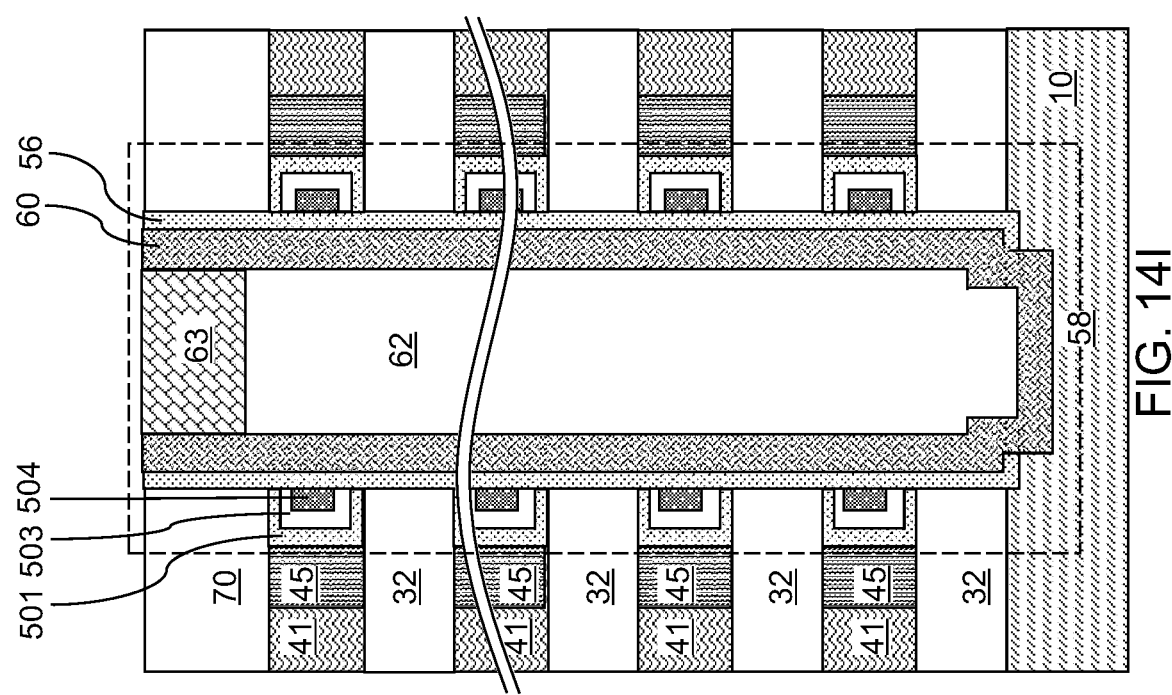

Referring to FIG. 14I, the processing steps of FIGS. 5E-5J can be performed to form a vertical semiconductor channel 60, a dielectric core 62, and a drain region 63 within each memory opening 49 and within each support opening 19. A memory opening fill structure 58 is formed in each memory opening 49, and a support pillar structure 20 is formed in each support opening 19.

Figure 15:
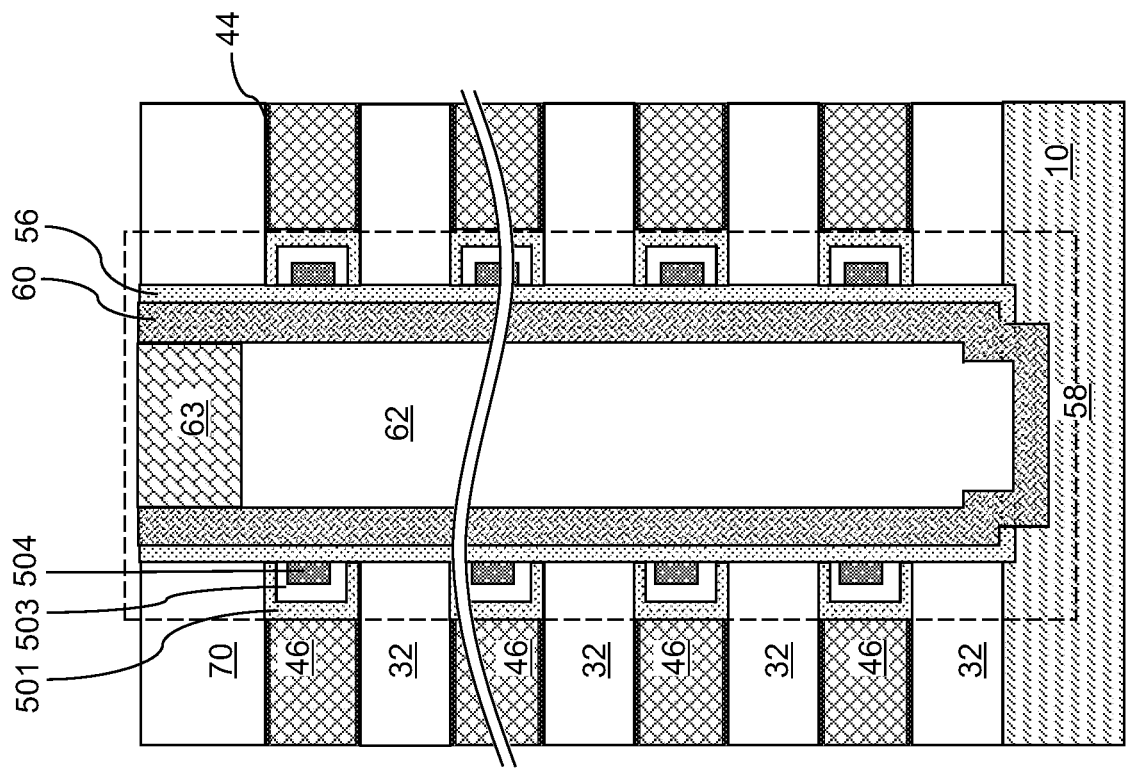
FIG. 15 is a schematic vertical cross-sectional view of a region of the fourth exemplary structure after an anneal process that converts composite metal layers into electrically conductive layers including an intermetallic alloy of aluminum and at least one metal according to an embodiment of the present disclosure.

Referring to FIG. 15, a thermal anneal process may be performed to convert each contiguous combination of an aluminum layer 41 and a plurality of annular metal portions 45 into a respective electrically conductive layer 46. In one embodiment, the elevated temperature and the duration of the thermal anneal process may be selected such that the electrically conductive layers 46 are formed with a lateral compositional gradient. In case the electrically conductive layers 46 include a lateral compositional gradient, the lateral compositional gradient may be formed such that an atomic concentration of aluminum increases with a lateral distance from a most proximal one of the memory opening fill structures 58 due to the proximity of the annular metal portions 45 to the memory opening fill structures. Alternatively, the elevated temperature and the duration of the thermal anneal process may be selected such that the electrically conductive layers 46 has a homogeneous composition throughout.

Aluminum oxide liners 44 can be formed during the anneal process due to reaction of the aluminum atoms from the aluminum layers 41 with oxygen-containing material portions. For example, the insulating layers 32 and the retro-stepped dielectric material portion 65. In this case, the aluminum atoms from the aluminum layers 41 react with the oxygen atoms from oxygen-containing dielectric material portions to form the aluminum oxide liners 44. The thickness of the aluminum oxide liners 44 depends on the temperature and the duration of the thermal anneal process and/or on the density and/or porosity of the dielectric oxide material, and may be in a range from 0.5 nm to 3 nm, such as from 1 nm to 2 nm, although lesser and greater thicknesses may also be employed. In one embodiment, an aluminum oxide liner 44 may include an upper horizontally-extending segment and a lower horizontally-extending segment.

Figure 16:
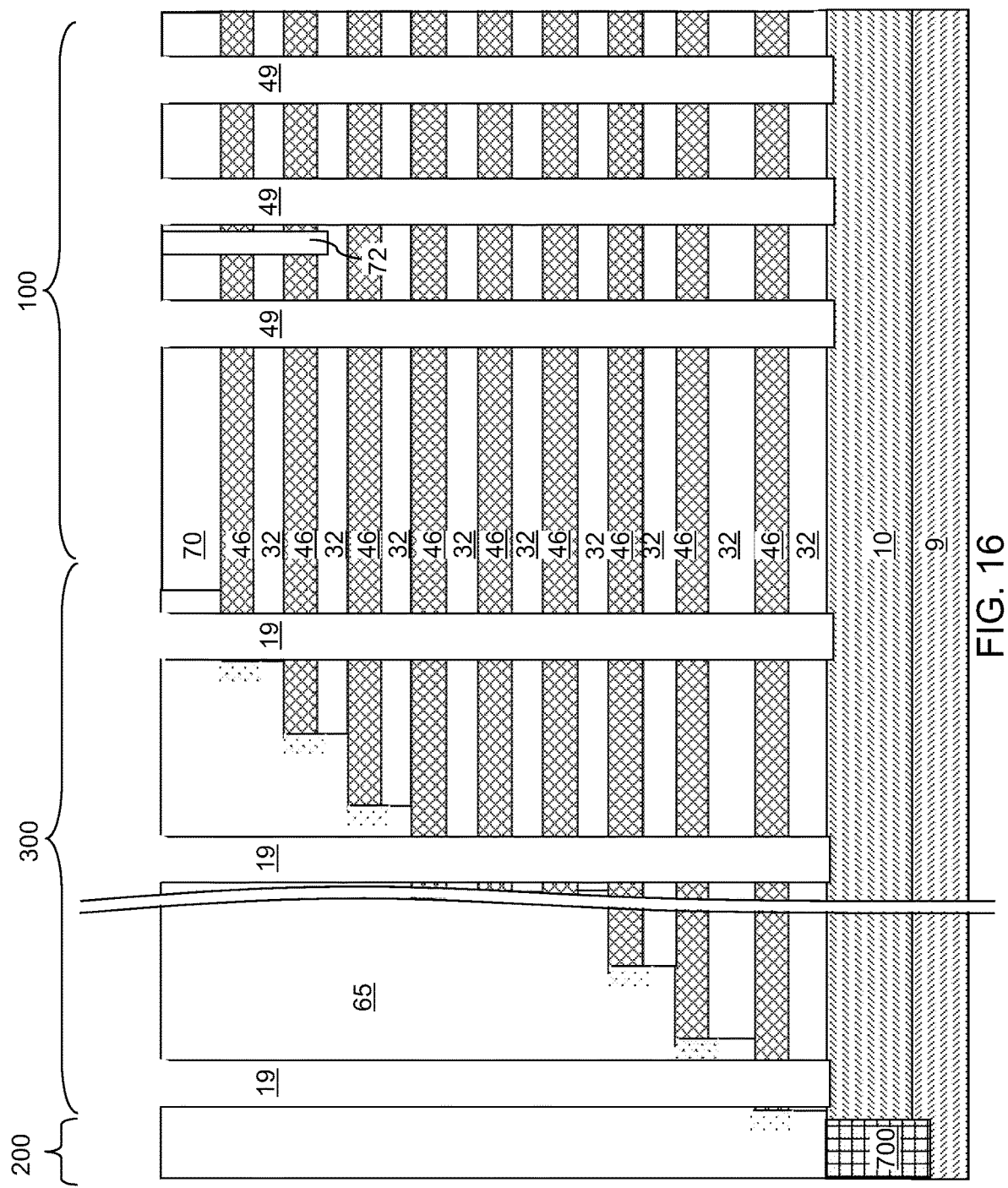
FIG. 16 is a vertical cross-sectional view of a fifth exemplary structure after formation of memory openings and support openings according to an embodiment of the present disclosure.

Referring to FIG. 16, a fifth exemplary structure according to an embodiment of the present disclosure can be derived from any of the first through fourth exemplary structures by forming an alternating stack of insulating layers 32 and electrically conductive layers 46 including an intermetallic alloy of aluminum and at least one elemental metal other than aluminum in lieu of the alternating stack of the insulating layers 32 and the aluminum layers 41 at the processing steps of FIG. 2. In this case, the at least one elemental metal in the intermetallic alloy may be selected from Ni, Ru, Fe, Co, Ti, Sc, Nb, Nd, or Cu. In one embodiment, each of the electrically conductive layers 46 may be deposited by sequentially depositing, in a forward order or a reverse order, an aluminum layer and a metal layer that includes at least one metal that forms an intermetallic alloy with aluminum, and by inducing a thermal anneal process that induces vertical diffusion of aluminum and the at least one metal. In one embodiment, the electrically conductive layers 46 may have a vertical compositional gradient therein. Alternatively, the electrically conductive layers 46 may have a homogeneous material composition throughout. Alternatively, the electrically conductive layers 46 may be deposited by sputtering an alloy of aluminum and at least one metal from separate targets, or by simultaneously sputtering aluminum and at least one metal from an alloy target. In this case, the electrically conductive layers 46 may have a homogeneous material composition throughout.

Subsequently, the processing steps of FIGS. 3, 4A, and 4B can be performed mutatis mutandis to form stepped surfaces, a retro-stepped dielectric material portion 65, the memory openings 49, and the support openings 19. The etch processes that pattern the alternating stack of the insulating layers 32 and the electrically conductive layers 46 may be modified in chemistry and/or time duration given the change in the material composition of the electrically conductive layers 46 relative to the material of the aluminum layers 41.

Any sequence of processing steps for formation of memory opening fill structures 58 and the support pillar structures 20 as described above may be employed with the modification of omission of the processing steps for formation of lateral recesses 349 and/or for formation of the annular metal portions 45. Subsequently, the processing steps of FIGS. 7A, 7B, 8, 9A, and 9B can be performed. The fifth exemplary structure may be formed such that the fifth exemplary structure has the same structural characteristics as any of the first, second, third, and fourth exemplary structures except for the absence of lateral compositional gradient within the electrically conductive layers 46.

Referring to all drawings and according to various embodiments of the present disclosure, a three-dimensional memory device is provided, which comprises: an alternating stack of insulating layers 32 and electrically conductive layers 46, wherein the electrically conductive layers 46 comprise an intermetallic alloy of aluminum and at least one metal other than aluminum; memory openings 49 vertically extending through the alternating stack (32, 46); and memory opening fill structures 58 located in a respective one of the memory openings 49 and comprising a respective vertical semiconductor channel 60 and a respective vertical stack of memory elements (which may comprise portion of a memory material layer 54 located at levels of the electrically conductive layers 46 or as a vertical stack of discrete memory elements 504).

In one embodiment, the insulating layers 32 comprise a dielectric oxide material other than aluminum oxide (such as silicon oxide); and each of the electrically conductive layers 46 is vertically spaced from a respective overlying one of the insulating layers 32 and a respective underlying one of the insulating layers 32 by a respective aluminum oxide liner 44.

In one embodiment, each of the aluminum oxide liners 44 comprises: an upper horizontally-extending portion contacting a top surface of a respective one of the electrically conductive layers 46; a lower horizontally-extending portion contacting a bottom surface of the respective one of the electrically conductive layers 46; and a plurality of tubular portions laterally surrounding a respective one of the memory opening fill structures 58 and vertically connecting the upper horizontally-extending portion and the lower horizontally-extending portion.

In one embodiment, each of the memory opening fill structures 58 comprises cylindrical silicon oxide surface segments located at levels of the electrically conductive layers and contacting an inner sidewall of a respective tubular portion of the aluminum oxide liners 44. The cylindrical silicon oxide surface segments may comprise surface segments of a blocking dielectric layer 52 including a silicon oxide material, or may comprise surface segments of a vertical stack of blocking dielectric portions 502 including a silicon oxide material.

In one embodiment, each of the electrically conductive layers 46 has a lateral compositional gradient such that an atomic concentration of aluminum increases with a lateral distance from a most proximal one of the memory opening fill structures 58. In one embodiment, the three-dimensional memory device comprises an insulating spacer 74 having a lengthwise sidewall that laterally extends along a first horizontal direction hd1 and contacting a sidewall of each of the insulating layers 32 and the electrically conductive layers 46, wherein a maximum atomic concentration of aluminum within the electrically conductive layers 46 is located at, or in proximity to, an interface with the insulating spacer 74.

In one embodiment, each of the electrically conductive layers 46 has a homogeneous material composition throughout, or has a vertical compositional gradient.

In one embodiment, the at least one metal is selected from Ni, Ru, Fe, Co, Ti, Sc, Nb, Nd, or Cu, and the intermetallic alloy comprises at least one of NiAl, $Ni_3Al$, $Ni_2Al_3$, $NiAl_3$, RuAl, FeAl, $Fe_3Al$, CoAl, TiAl, $TiAl_3$, $ScAl_3$, ScAl, $ScAl_2$, $Sc_2Al$, $Nb_3Al$, $Nb_2Al$, $NbAl_3$, $NdAl_2$, $NdAl_3$, NdAl, $CuAl_2$, CuAl, or $Cu_3Al$.

In one embodiment, each of the memory opening fill structures 58 comprises a vertical stack of silicon oxide portions located at levels of the electrically conductive layers 46 and in contact with a respective vertical stack of memory elements. The vertical stack of silicon oxide portions may comprise portions of a blocking dielectric layer 52 including a silicon oxide material, or may comprise a vertical stack of blocking dielectric portions 502 including a silicon oxide material. The vertical stack of memory elements may comprise portions of a memory material layer 54 located at levels of the electrically conductive layers 46, or as a vertical stack of discrete memory elements 504.

In one embodiment, the vertical stack of silicon oxide portions may comprise a vertical stack of blocking dielectric portions 502 including a silicon oxide material, and each silicon oxide portion within the vertical stack of silicon oxide portions comprises: an upper horizontal portion contacting a top surface of a respective one of the memory elements; a lower horizontal portion contacting a bottom surface of the respective one of the memory elements; and a tubular portion connecting an outer periphery of the upper horizontal portion to an outer periphery of the lower horizontal portion and contacting an outer sidewall of the respective one of the memory elements.

In one embodiment shown in FIG. 11, each of the memory opening fill structures 58 comprises a memory material layer 54 continuously extending vertically through each of the electrically conductive layers and having portions which protrude laterally into the silicon oxide portions 502. In the embodiment of FIG. 11, each of the memory opening fill structures 58 comprises a memory material layer 54 (which may comprise a charge storage layer in some embodiments) continuously extending vertically through each of the electrically conductive layers 46 and having a greater lateral thickness at levels of the electrically conductive layers 46 than at levels of the insulating layers, wherein portion of the memory material layer located at the levels of the electrically conductive layers 46 comprise the respective vertical stack of memory elements.

In one embodiment, each vertical stack of memory elements comprises a respective vertical stack of discrete memory elements 504 that are vertically spaced apart; and each of the discrete memory elements 504 has a respective height that is less than a vertical thickness of a respective one of the electrically conductive layers 46 located at a same level.

In one embodiment, each of the memory opening fill structures 58 comprises: a blocking dielectric layer 52 continuously extending vertically through each of the electrically conductive layers 46; and a memory material layer 54 continuously extending vertically through each of the electrically conductive layers 46 and contacting an inner sidewall of the blocking dielectric layer 52, wherein portions of the memory material layer 54 located at levels of the electrically conductive layers 46 comprise a respective vertical stack of memory elements.

In one embodiment, each of the electrically conductive layers 46 is laterally spaced from the blocking dielectric layer 52 by a respective tubular portion of an aluminum oxide liner 44; and the blocking dielectric layer 52 has a straight outer sidewall that contacts a respective sidewall of each of the insulating layers 32.

The various embodiments of the present disclosure can be employed to reduce the vertical pitch of the alternating stack of insulating layers 32 and electrically conductive layers 46 by self-aligned formation of the aluminum oxide liners 44. The aluminum oxide liners 44 can be formed with self-alignment by reaction of aluminum atoms provided from the aluminum layers 41 or from the electrically conductive layers 46 with oxygen atoms provided from the insulating layers 32 and/or from blocking dielectric layers 52. Replacement of sacrificial material layers from between vertically neighboring pairs of insulating layers 32 is not necessary, and the vertical pitch of periodicity within the alternating stack (32, 46) can be reduced compared to prior art structures that require replacement of sacrificial material layers with electrically conductive layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate, wherein the electrically conductive layers comprise an intermetallic alloy of aluminum and at least one metal other than aluminum;
memory openings vertically extending through the alternating stack;
memory opening fill structures located in a respective one of the memory openings and comprising a respective vertical semiconductor channel and a respective vertical stack of memory elements; and
an insulating spacer having a lengthwise sidewall that laterally extends along a first horizontal direction and contacting a sidewall of each of the insulating layers and the electrically conductive layers,
wherein each of the electrically conductive layers has a lateral compositional gradient such that an atomic concentration of aluminum increases with a lateral distance from a most proximal one of the memory opening fill structures; and
wherein a maximum atomic concentration of aluminum within the electrically conductive layers is located at or in proximity to an interface with the insulating spacer.

2. The three-dimensional memory device of claim 1, wherein:
the insulating layers comprise a dielectric oxide material other than aluminum oxide; and
each of the electrically conductive layers is vertically spaced from a respective overlying one of the insulating layers and a respective underlying one of the insulating layers by a respective aluminum oxide liner.

3. The three-dimensional memory device of claim 2, wherein each of the aluminum oxide liners comprises:
an upper horizontally-extending portion contacting a top surface of a respective one of the electrically conductive layers;
a lower horizontally-extending portion contacting a bottom surface of the respective one of the electrically conductive layers; and
a plurality of tubular portions laterally surrounding a respective one of the memory opening fill structures and vertically connecting the upper horizontally-extending portion and the lower horizontally-extending portion.

4. The three-dimensional memory device of claim 3, wherein each of the memory opening fill structures comprises cylindrical silicon oxide surface segments located at levels of the electrically conductive layers and contacting an inner sidewall of a respective tubular portion of the aluminum oxide liners.

5. The three-dimensional memory device of claim 1, wherein the at least one metal is selected from Ni, Ru, Fe, Co, Ti, Sc, Nb, Nd, or Cu.

6. The three-dimensional memory device of claim 5, wherein the intermetallic alloy comprises at least one of NiAl, $Ni_3Al$, $Ni_2Al_3$, $NiAl_3$, RuAl, FeAl, $Fe_3Al$, CoAl, TiAl, $TiAl_3$, $ScAl_3$, ScAl, $ScAl_2$, $Sc_2Al$, $Nb_3Al$, $Nb_2Al$, $NbAl_3$, $NdAl_2$, $NdAl_3$, NdAl, $CuAl_2$, CuAl, or $Cu_3Al$.

7. The three-dimensional memory device of claim 1, wherein:
each of the memory opening fill structures comprises a vertical stack of silicon oxide portions located at levels of the electrically conductive layers and in contact with a respective vertical stack of memory elements; and
each silicon oxide portion within the vertical stack of silicon oxide portions comprises:
an upper horizontal portion contacting a top surface of a respective one of the memory elements;

a lower horizontal portion contacting a bottom surface of the respective one of the memory elements; and a tubular portion connecting an outer periphery of the upper horizontal portion to an outer periphery of the lower horizontal portion and contacting an outer sidewall of the respective one of the memory elements.

8. The three-dimensional memory device of claim 7, wherein each of the memory opening fill structures further comprises a memory material layer continuously extending vertically through each of the electrically conductive layers and having portions which protrude laterally into the silicon oxide portions.

9. The three-dimensional memory device of claim 1, wherein each of the memory opening fill structures comprises:

a blocking dielectric layer continuously extending vertically through each of the electrically conductive layers; and a memory material layer continuously extending vertically through each of the electrically conductive layers and contacting an inner sidewall of the blocking dielectric layer, wherein portions of the memory material layer located at levels of the electrically conductive layers comprise a respective vertical stack of memory elements.

10. The three-dimensional memory device of claim 9, wherein:

each of the electrically conductive layers is laterally spaced from the blocking dielectric layer by a respective tubular portion of an aluminum oxide liner; and the blocking dielectric layer has a straight outer sidewall that contacts a respective sidewall of each of the insulating layers.

* * * * *